United States Patent [19]

Sharnoff

[11] Patent Number: 4,910,759
[45] Date of Patent: Mar. 20, 1990

[54] XRAY LENS AND COLLIMATOR

[75] Inventor: Mark Sharnoff, Newark, Del.

[73] Assignee: University of Delaware, Newark, Del.

[21] Appl. No.: 189,525

[22] Filed: May 3, 1988

[51] Int. Cl.$^4$ ............................................. G21K 1/02
[52] U.S. Cl. ................................ 378/147; 378/149; 378/161
[58] Field of Search .................... 378/147, 149, 161

[56] References Cited

U.S. PATENT DOCUMENTS

| | | | |
|---|---|---|---|
| 1,156,906 | 10/1915 | Kelly | 378/147 |
| 2,331,586 | 10/1943 | Wasisco | 250/105 |
| 2,578,722 | 12/1951 | McCartney et al. | 250/52 |
| 2,638,554 | 5/1953 | Bartow et al. | 250/99 |
| 2,730,566 | 1/1956 | Bartow et al. | 378/147 |
| 3,113,214 | 12/1963 | Furnas | 250/105 |
| 3,581,094 | 5/1971 | Peyser et al. | 250/105 |
| 3,777,148 | 12/1973 | Miraldi | 250/505 |
| 3,839,634 | 10/1974 | Buchmann | 250/213 VT |
| 3,869,615 | 3/1975 | Hoover et al. | 378/147 |
| 3,912,936 | 10/1978 | Cunninghame et al. | 250/512 |
| 4,086,494 | 4/1978 | Malek | 250/505 |
| 4,101,766 | 7/1978 | Minami et al. | 250/320 |
| 4,277,684 | 7/1981 | Carson | 250/445 T |
| 4,286,156 | 8/1981 | Wagner | 250/363 |
| 4,288,697 | 9/1981 | Albert | 250/505 |
| 4,359,642 | 11/1982 | Heinz et al. | 378/150 |
| 4,361,899 | 11/1982 | Amplatz | 378/21 |
| 4,395,775 | 7/1983 | Roberts et al. | 378/145 |
| 4,419,585 | 12/1983 | Strauss et al. | 250/505.1 |
| 4,419,764 | 12/1983 | Kinanen | 378/153 |
| 4,460,832 | 7/1984 | Bigham | 250/505.1 |
| 4,489,426 | 12/1984 | Grass et al. | 378/150 |
| 4,532,646 | 7/1985 | Gilbert | 378/207 |
| 4,550,258 | 10/1985 | Omata et al. | 260/505.1 |
| 4,623,794 | 11/1986 | Rose et al. | 250/396 R |
| 4,651,012 | 3/1987 | Clark et al. | 250/505.1 |
| 4,675,893 | 6/1987 | Duinker et al. | 378/151 |
| 4,677,652 | 6/1987 | Duinker et al. | 378/151 |
| 4,741,012 | 4/1988 | Duinker et al. | 378/145 |
| 4,754,147 | 6/1988 | Maughan et al. | 250/505.1 |
| 4,766,603 | 8/1988 | Okabe et al. | 378/152 |

OTHER PUBLICATIONS

Znotins, T. A., "Excimer Lasers in Microlithography", *Lasers & Optronics*, (May, 1988), pp. 55–61.

*Primary Examiner*—Carolyn E. Fields
*Assistant Examiner*—David P. Porta
*Attorney, Agent, or Firm*—Connolly and Hutz

[57] ABSTRACT

A lens and collimator apparatus for focusing and increasing the intensity of an x-ray beam at a specimen point. A screen with an aperture of pupil diameter comparable and no larger than the x-ray transverse coherence length and no smaller that the specimen diameter focuses the x-ray beam by diffraction. The screen is positioned from the specimen plane proportional to the ratio of the square of the pupil diameter to the mean wavelength of the x-ray beam. A plurality of parallel screens can also be used.

8 Claims, 7 Drawing Sheets

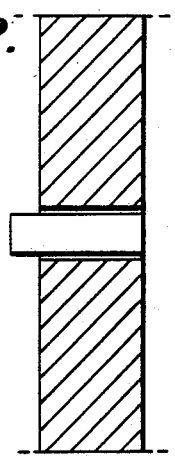
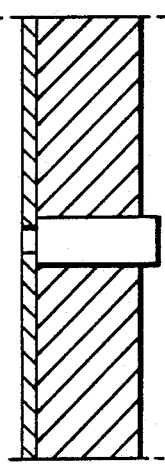
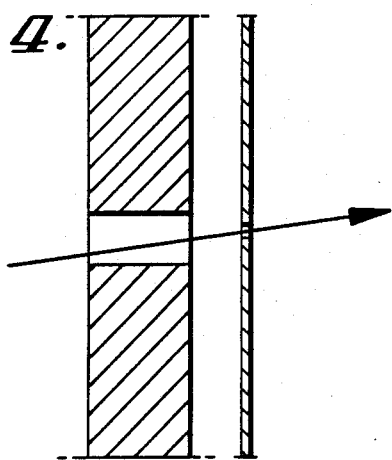
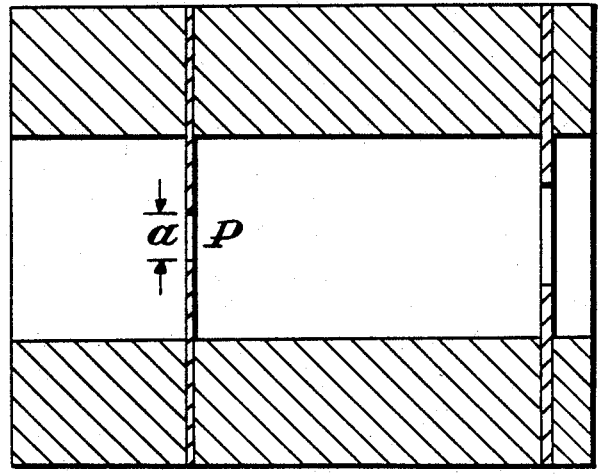

XRAY LENS AND COLLIMATOR

This invention relates to design and fabrication of Xray focussing devices of high efficiency and low dispersion.

BACKGROUND OF THE INVENTION

In the historic sense, Xrays are the electromagnetic emanations produced when an electron that has kinetic energy of hundreds or thousands of electron volts is decelerated as it impinges upon dense materials or radiatively combines with a vacancy in an inner atomic shell. The wavelengths of such emanations normally lie within the range 0.001 nanometers (nm) and 50 nm, and, in the modern sense, Xrays (or X-radiation) can be considered to be any electromagnetic radiation, however produced, whose wavelength lies within this range. Over all but the last few ocataves of this range the index of refraction of most materials differs only very slightly from unity, and reflection and refractive phenomena can be observed only with special precaution. It is accordingly difficult to concentrate or focus the energy that may be contained in an Xray beam. However, over certain wavelength ranges Xrays can be focussed by passage though specially designed Fresnel zone plates or by reflection from lamelar mirrors analogous to the highly reflective dielectric multilayer mirrors used in lasers. The focussing action of a Fresnel zone plate results not from refraction, but from multiple-beam interference of the Xrays; that of the mirrors results also from multiple-beam interference, rather than directly via simple reflection. Because the features of a multiple-beam interference pattern are quite noticeably shifted by a change in the wavelength in which they are formed, the focal length of a zone plate depends strongly upon the wavelength of the radiation focussed; i.e., exhibits strong dispersion. The reflection efficiency of a lamellar mirror used to focus an oncoming Xray beam must also be strongly dependent upon either wavelength or angle of incidence; its curvature must therefore be limited as, consequently, will be either the sharpness of the bandwidth of its focus. Thus, either kind of focussing device may be of limited suitability when the X-radiation to be focussed is not monochromatic.

The smallness of the wavelengths of Xrays, which is at the root of the difficulty in refracting them, has also the consequence that Xrays can be easily collimated by passing them through a small opening or aperture in a screen of absorbing material. The diffraction of X-rays by passage through any hole of macroscopic size is inconspicuous, and the line defined by small, coaxial apertures in screens some distance apart will be closely followed by Xrays sent through them, which Xrays thereafter may be considered to form an Xray beam. If the last such aperture is made exceedingly small, however, the diffraction of Xrays can be observed as a spreading of the transmistted beam beyond the confines of that aperture's geometrical shadow. It is not commonly realized that diffraction from an aperture of suitable size can also act to concentrate or focus a beam of Xrays, and it appears not to have been recognized previously that the focal properties of an aperture can be made usefully less wavelength-sensitive than those of a Fresnel-zone plate. An aperture of appropriate design can then serve as a focussing lens for broad-band X-radiation.

OBJECT AND SUMMARY OF THE INVENTION

It is a principal object of the invention to provide devices capable of focussing or intensifying the focus of a beam of Xrays whose composition need not be monochromatic and may perhaps contain significant components as much as an octave or more apart. The devices are of rugged and relatively simple construction, tolerant of substantial variation in the size and relative placement of essential parts, and can be operated in air or other inert gas as well as in vacuum. Such devices would be useful for Xrays produced by any Xray source, including conventional Xray tubes and synchrotrom Xray sources, whether or not intensified by means of a wiggler or an undulator. It is anticipated that such devices would find application in photolithography, particularly in the fabrication of systems, like integrated electronic circuits, whose component regions may have cross-sectional dimensions of the order of micrometers or less and may upon occasion be etched deeply into the substrate.

Each device would have some ability to operate as a collimator, and the provision of efficient, broad-band Xray collimating devices is a secondary object of the invention. The following description treats, as a specific example, a collimator for soft monochromatized Xrays that illustrates the design principles of aperture-based lenses and the problems associated with their construction and operation.

BRIEF DESCRIPTION OF THE FIGURES

FIG. 1 is an axial cross section of a hole through a piece of Xray opaque material. The Xray opaque material is crosshatched.

FIG. 2 is an axial cross section of a uniform channel of Xray transparent material through a slab of Xray opaque material. The Xray opaque material is cross-hatched.

FIG. 3 is an axial cross section of a collimator formed by a hole and channel against which the hole abuts in coaxial register. Xray opaque material is cross-hatched.

FIG. 4 is a longitudinal cross section of a collimator formed by hole and a channel that are neither abutting nor in coaxial registry. A ray passing through the collimator is represented by the diagonal arrow. Xray opaque material is cross-hatched.

FIG. 5 is an axial cross section of a collimator that has a pupil at P.

DETAILED DESCRIPTION OF THE INVENTION

Figure 6:
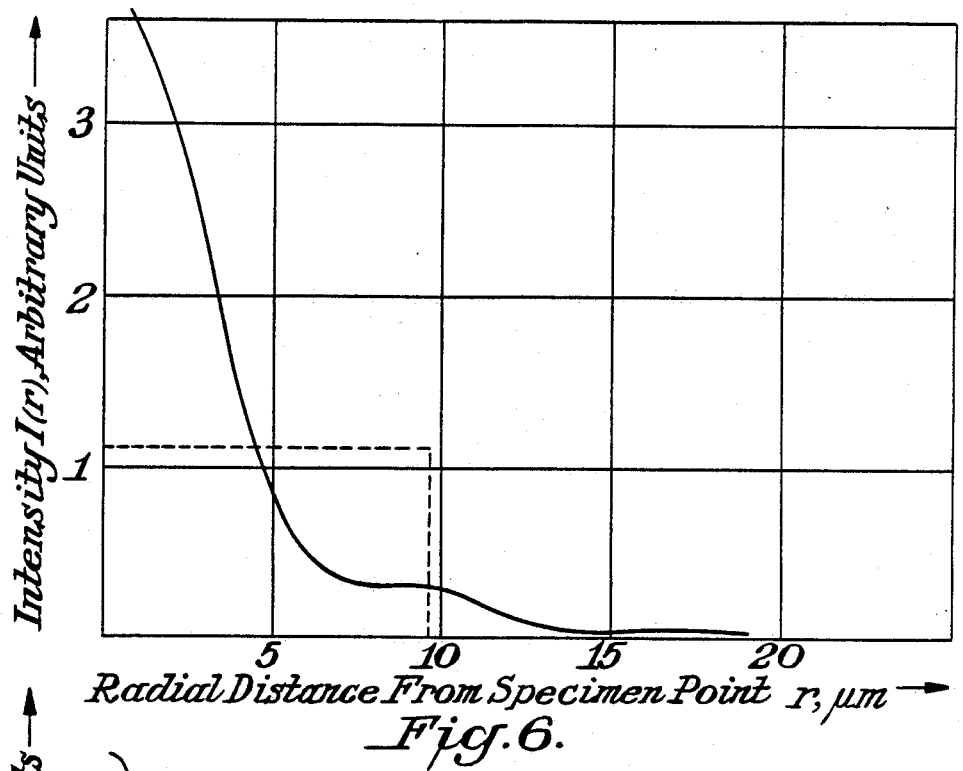
FIG. 6 is a plot of a curve that represents the Xray intensity I(r) versus distance r in a plane illuminated through an optimal pupil. The dashed line is a plot of the Xray intensity that would prevail in the absence of diffraction.

The invention provides devices for concentrating the energy of an available Xray beam. The concentration achieved may be greater than twofold, and it can be achieved even when the available Xray beam is white, consisting, like ordinary white light, of elementary beams whose wavelengths exhibit a total variation, from shortest to longest, as large as a factor of two or more, and whose intensities are all comparable to one another. Each device utilizes an aperture pierced through a piece of Xray opaque material, or several apertures in succession. Their construction is simple and robust and, assuming properly chosen design dimensions, their functioning is tolerant of deviations as large as 10% in the sizes or relative positionings of their principal parts.

One of the characteristic properties of X-radiation is its ability to ionize material through which it passes. In technology this fact can be turned to advantage in the exposure of photoresists when it is intended to produce, in the developed resists, very fine surface detail or structures whose dimensions are small compared to $\frac{1}{2}$ $\mu$m or other optical wavelength. The speed with which a photoresist can exposed is approximately proportional to the power carried in the Xray beam to be used. But the production of fine etched structures in photoresist may dictate that the Xrays incident on the photoresist be constricted to a cross-section small in comparison with the available Xray beam. If an Xray focussing device is unavailable, the time required to carry out the exposure will be inversely proportional to the fraction of the Xray beam represented by the constricted portion used for the exposure. The reduction in beam throughput may create an embarrassing limitation in the speed with which electronic semiconductor integrated circuit "chips" can be individually or serially manufactured by Xray photoresist-assisted methods.

If an Xray focussing device is available the limitation may be alleviated. But the photoresist surface must be located more or less accurately in the focal plane of the focussing device, and if the device is highly dispersive and the available Xray beam not very monochromatic, the Xray beam must be filtered before use. The loss of intensity during filtering or monochromatization may largely offset the gain that accrues by concentrating what remains. A focussing device whose operating parameters were not highly sensitive to Xray wavelength would therefore have advantages.

Another application for an Xray focussing device can be found in science, where it is not infrequently desired to study the submicroscopic structure of systems or materials with the help of Xray diffraction. The study by soft Xray diffraction of non-crystalline systems like amorphous materials, bacteria, or the organelles or nuclei of eukaryotic cells places unusual demands upon the collimator of the Xray camera or diffractometer, and it will be seen below how the provision of appropriate focussing will improve the degree to which the collimator can satisfy them. Unlike diffraction by ordinary crystals, that occurs intensely only at the discrete angles determined by the Bragg or Ewald constructions, diffraction from non-crystalline specimens is rather smoothly distributed over all angles and is nearly devoid of sharp, highly intense features. Extraordinary means must therefore be used to reduce the background that results from stray Xrays scattered from parts of the apparatus, rather than the specimen itself. [See, for instance, p. 316 of the book *X-Ray Microscopy*, G. Schmahl and D. Rudolph, eds., Berlin, Springer, 1984]. In addition, the coherence length of the collimated Xray beam must be unusually long, at least as long as the sizes of the submicroscopic structures of interest, which themselves may become as large as those just barely resolvable in the light microscope.

With care in monochromatization, the longitudinal (or temporal) coherence length of an Xray beam composed of X-radiation from a synchrotron can attain values as great as several micrometers ($\mu$m). [For a discussion of coherence lengths, see, for example, M. V. Klein, *Optics*, New York, Wiley, 1970, pp. 257 and 272.] The transverse coherence length of such an Xray beam is not not normally so large as this, but can be augmented to half the value of the longitudinal coherence length by passing the synchrotron radiation through a collimator which, if well designed, will not affect the longitudinal coherence length. Once this ratio of coherence lengths has been realized, the largest portion of any sample that will contribute an individual, unitary Xray diffraction pattern can be thought of as a sphere whose diameter is equal to one half the longitudinal coherence length of the Xray beam. Further augmentation of the transverse coherence length would enlarge the transverse diameters of that sample portion, but not its longitudinal extent. Thus, if Xray diffraction experiments are to take full advantage of the coherence of an available Xray beam, the transverse coherence length of the X-radiation to which the specimens are exposed must be not smaller than one half the longitudinal coherence length of the available beam.

In the description hereinbelow, a collimated Xray beam is an Xray beam that has passed through a collimator under discussion. An incident Xray beam is an Xray beam incident upon a collimator under discussion, or portion thereof, irrespective of whether the Xray beam has been passed through a collimator before reaching the collimator under discussion. Diffracted X-radiation is X-radiation derived from the incident Xray beam by diffraction from the collimator or any portion thereof.

One of the preferred embodiments of the invention will be exemplified by a collimator designed for a uniform, monochromatized incident Xray beam whose wavelength has any value preselected within the range 2.2 to 4.5 nm and whose longitudinal coherence length at wavelength 3.2 nm is 6.4 μm. These numbers represent the design goals for Xray beam to be made available at the X1 beam port at the National Synchrotron Light Source at Brookhaven National Laboratory. If good advantage is to be taken of the properties of this Xray beam, a collimator upon which it is made incident must impart to it a transverse coherence length of at least 3.2 μm when the preselected wavelength is 3.2 nm. Correspondingly, the angular width of the collimated Xray beam incident upon any specimen placed at design position within the collimated Xray beam must be confined to 0.001 radian or less.

A collimator for Xrays could consist of a small hole drilled, punched, or etched through a thin piece of material opaque to Xrays, such as lead, as indicated in FIG. 1. Such a collimator will be called a pinhole collimator. A collimator could also consist of a narrow, uniform channel of Xray-transparent material, such as beryllium, or silicon nitride, embedded in and passing through a slab of Xray-opaque material, as indicated in FIG. 2. Such a collimator will be called a simple collimator. A collimator could also consist of several such holes or channels brought into coaxial registry, through which the Xrays would pass sequentially, as indicated in FIGS. 3 and 4. If several, the pieces and slabs need not be in physical contact with one another, and need not be of the same chemical composition or, individually, of homogeneous composition. If several, the Xray-transparent channels need not be of one and the same chemical composition. Nor need each or any channel or hole be circular in cross-section, or perfectly coaxial with any other. Whatever the arrangement of individual pieces and slabs, holes and channels, the collimating action of any collimator will be determined principally by the area common to the projection of all hole or channel cross-sections upon a plane perpendicular to any line that can be imagined to pass through all of the holes or channels without also passing through any of the Xray opaque material in the pieces or slabs in which they have been drilled, punched, etched, or embedded. Such a line will be called a ray, and such area the common area projected along the ray. A ray has been indicated in FIG. 4. Absent the diffraction of Xrays, the Xray beam passing through a collimator along the direction any ray will appear to have passed through a simple collimator whose axis is parallel to the ray and whose channel cross section, taken perpendicular to the axis, is congruent with the common area projected along the axis. If for any collimator the bundle of all possible rays can be contained within a right-circular cone or right-circular cylinder, the axis of symmetry of that cone or cylinder defines the collimator axis. The common area projected along the axis will be called the collimator aperture. If there can be found within a collimator one and only one cross section, taken perpendicular to the collimator axis, that coincides with said collimator aperture, that cross section will be called the pupil of the collimator.

During the operation of any collimator, the collimator axis should point towards the source of Xrays, whose distance from the collimator will normaly be many times the maximum dimension of the collimator itself. If a collimator in operation has a pupil of diameter a, then at a point P exposed to the collimated Xray beam on the collimator axis at a distance s behind the pupil, the angular width of the collimated Xray beam will be not greater than a/s. If the collimated beam is monochromatic and has wavelength λ, then its transverse coherence length at point P will be not less than λ(s/a). [See, for instance, the discussion in p. 257 of said book by Klein.]

Let it be assumed that a collimator to be designed will have an axis and a pupil and that the intended position of a small sample or specimen is on the collimator axis, 4.0 centimeters (cm) behind the pupil. If there is to be imposed a limitation of 0.001 radian on the full angular spread of the radiation incident upon the specimen, the diameter of said pupil should not exceed 0.0040 cm, or 40 μm. Since the diameter of a specimen like a bacterium would be small compared to such value, it would be disadvantageous to make the pupil so large as indicated. Much of the collimated X-ray beam would pass outside the specimen, rather than penetrating it. By impinging directly upon the walls of the Xray camera, the by-pass radiation would create fluorescence or ionization that acted as a source of noise to the Xray film or other detector of the waves reaching it via diffraction by the specimen.

It is therefore apparent that the diameter of the pupil should be reduced to a value, a, comparable to the diameter of the specimen or the coherence diameter, whichever is to be the smaller. In the present instance, the diameter in question may be taken to be 3.2 micrometers, which value is half the expected longitudinal coherence length of the monochromatized synchrotron light. If a pupil diameter of 3.2 micrometer is chosen, diffraction will cause the X-radiation passing through it to spread out; λ=3.2 nm, the radius of the Airy disk that represents the spreading of the radiation observed at a distance d=4 cm behind the pupil would be 1.22 λd/a ≈50 μm. [See, for instance, the book *Fundamentals of Optics*, by F. A. Jenkins and H. E. White, 4th ed., New York, McGraw-Hill, 1976, p. 329]. Again, most of the collimated X-ray beam would miss the specimen, and the signal to noise ratio in the specimens's diffraction pattern would be low. Clearly, matters could be improved by moving the specimen closer to the pupil, where it would intercept a larger fraction of the X-radiation diffracted by the pupil.

There is a practical lower limit to the pupil-to-specimen distance, however. This is created by the occurrence of fluorescence (both Xray and visible) at the edges of the holes and within any of the channels that make up the collimator. If the fluorescence is allowed to penetrate into the Xray camera, the film or detector would record it just as though it had been X-radiation diffracted from the specimen. Again, the signal to noise ratio of the diffraction pattern would be degraded. This could be largely avoided if, between the pupil and the specimen, and between any channel and the specimen, is interposed a small hole in a piece of Xray opaque material, or a succession of such elements. It is important that the X-radiation diffracted by the pupil not create further fluorescence by striking any portion of the edges of such element or elements; and these could, of course, be considered part of the collimator itself. The greater the distance between such element(s) and the hole edges or channels where the fluorescence occurred, the more effectively will the element(s) screen the Xray camera or detector from that fluorescence. It is the requirement for such screening that imposes a lower limit on the distance between the collimator pupil and the specimen.

The necessity of screening out fluorescence imposes on the collimator's mechanical design the problems of centering three or four widely spaced ($\approx 1$ cm) holes or channels of very small diameter ($\approx 10$–25 µm) upon a common axis and of defining that axis with respect to the external contours of the collimator. These problems will be dealt with after an important principle has been identified that should govern the choice of pupil diameter in the absence of complications from fluorescence.

Let it be supposed that a collimator to be designed has a both an axis and a pupil, and that during the collimator's use a uniform and monochromatic Xray beam travelling in the direction of the collimator's axis is to be incident upon it. It is intended that the Xray beam enter the collimator and impinge upon and pass through the pupil, whereupon it is diffracted into the space behind the pupil, in which space the specimen is located. Referring to FIG. 5, the Xray beam is incident from the left of the Figure and the space behind the pupil is represented by that portion of the Figure that both lies to the right of a line passing vertically through the pupil at P and that is also not occupied by Xray-opaque material. A portion of the X-radiation diffracted into the space behind the pupil is received by the specimen. Let the specimen be placed accurately upon the collimator's axis at a preselected distance, d, behind the pupil. It is normal, but not necessary, that the specimen lie behind the collimator itself, that is, to the right of any plane that lies, at least in part, in the space behind the pupil and also, in part, within the Xray-opaque material or materials of which the collimator is constructed. Let it be required to find the value, D, of the optimal diameter of the pupil.

An optimal value of the pupil diameter can be found, as explained hereinbelow. The optimal value is given by the formula $$D = 1.72\sqrt{(\lambda d)},$$

in which $\lambda$ is the wavelength of the monochromatic incident Xray beam. (A more accurate value is $D = 1.72281\sqrt{(\lambda d)}$.) A pupil whose diameter has the optimal value is called an optimal pupil.

Let the intensity of an incident Xray beam be defined as the energy that it conveys in one second divided by the area of the cross-section of the incident Xray beam, taken perpendicular to the collimator axis, and let said intensity be denoted by $I_o$. Similarly, let the intensity of diffracted X-radiation at any point be defined as the energy conveyed by diffracted X-radiation in one second through any small sphere surrounding that point, divided by area of the maximal cross-section of said sphere. In the practice of the invention it will normally be the case that the diameter of the cross section of the Xray beam incident upon the collimator is larger than the value D. Then, when the diameter of the pupil is made to have the value D, the total energy of the diffracted X-radiation that has passed through the pupil will be smaller than the total energy of the incident Xray beam. Such diminution nothwithstanding, the intensity of the diffracted X-radiation incident upon the small specimen will be several times as great as $I_o$. Since the total energy of the diffracted X-radiation incident upon any plane in the space behind the pupil cannot be greater than that transmitted through said pupil, $(\pi/4)D^2 I_o$, the diameter of the region of enhanced X-ray intensity at the specimen must actually be smaller than the diameter of the pupil: the pupil has a focussing effect.

The specimen point is defined as the point on the collimator axis that lies at the preselected pupil-to-specimen distance d behind the pupil. The specimen plane is defined as the plane that transects the collimator axis perpendicularly at the specimen point. The specimen coherence sphere is defined as the sphere whose center lies at the specimen point and whose diameter is half has great as the longitudinal coherence length of the incident monochromatic Xray beam. The specimen coherence circle is defined as that portion of the specimen plane that lies within the specimen coherence sphere. The specimen diameter is the diameter of the smallest sphere whose center lies at the specimen point and whose surface does not intersect any portion of a specimen when a point of the specimen lies at the specimen point. The intensity of the diffracted X-radiation at a point upon the specimen plane at a distance r from the specimen point is denoted as I(r). When the pupil is an optimal pupil, the intensity I(0) at the specimen point has the value 3.38 times the value of $I_o$. (A more accurate value is $I(0) = 3.37832 I_o$). A curve representing the dependence of I(r) upon r when $\lambda = 3.2$ nm and $d = 4.0$ cm and the pupil diameter has the optimal value 19.5 µm is plotted in FIG. 6. The dashed line also plotted in FIG. 6 represents the form that I(r) would assume if the diffracted radiation obeyed not the laws of wave optics but the laws of geometrical optics, in which case the intensity would have the value $I_o$ at values of r smaller than D/2 and the value 0 otherwise. At values of r larger than were convenient to show in FIG. 6, the curve shown becomes asymptotic to the axis of abscissae. The Figure represents all portions of the curve that correspond to $I(r) > I(0)/100$.

A useful indication of a collimator's performance in concentrating upon a specimen the energy available in a incident Xray beam is provided by the radius of an optimal pupil's focal spot, which focal spot is defined as that portion of the specimen plane within which the X-radiation diffracted from an optimal pupil has an intensity not less than one half its intensity at the specimen point. Referring to FIG. 6, it can be seen that when $\lambda = 3.2$ nm and $d = 4.0$ cm, the radius of an optimal pupil's focal spot is approximately 3.42 µm. This is somewhat larger than the expected radius of the specimen coherence sphere in the Xray beam emanating from the aforementioned X1 beam port, which, in accord with discussion hereinabove, is 1.6 µm. The comparison suggests that if the collimator and specimen are to be used in said Xray beam, a value of d somewhat smaller than 4 cm should be used. A smaller value of d would require a smaller value of D, as well. It has been shown mathematically by the applicant in a private unpublished memorandum that the following scaling rule applies to diffraction by a circular pupil: Let the pupil have diameter a, and let the distribution of intensity of the diffracted X-radiation in the plane that transects the collimator axis perpendicularly at a distance s behind the pupil be represented by the function f(r), wherein the independent, non-negative variable r represents, when greater than zero, the distance from a point not on the collimator axis to the nearest point upon the collimator axis. If the diameter of the pupil is decreased by the factor Q, the distribution of intensity of the diffracted X-radiation in the plane at distance $Q^2 s$ behind the pupil will be given by the function $g(r) = f(Q^{-1} r)/Q^2$.

If s and a are set equal to 4.0 cm and 19.5 μm, which are the preselected values of d and D, then the function f(r) coincides with the function I(r) whose curves is given in FIG. 6. Then according to the scaling rule, the curve in FIG. 6 can be used to describe the distribution of diffracted X-radiation in any specimen plane illuminated through an optimal pupil. If the preselected pupil-to-specimen distance is reduced to $Q^2d$ and the pupil diameter to QD, then, once the labelled values of the abscissae of FIG. 6 have been reduced by the factor Q, and the labelled values of the ordinates of FIG. 6 have been increased by the factor $Q^2$, which relabellings are carried out without any alteration of the curve, the Figure so relabelled will give the distribution of intensity in the new plane. In particular, the new pupil will be an optimal pupil, and radius of its focal spot will be found to be reduced by the factor Q from the former value.

Thus, if it is desired to reduce from 3.42 μm to 1.60 μm the radius of the focal spot, then the pupil diameter should be reduced in the ratio 1.60:3.42, and the pupil-to-specimen distance by the square of this ratio. For $\lambda = 3.20$ nm, the values of d and D that accomplish this would be 0.876 cm and 9.12 μm, respectively. The angle D/d subtended by the pupil at the new specimen point would be 0.000104 radian. This value remains compatible with the 0.001 radian limit set forth earlier respecting angular definition of the collimated beam and assures that the transverse coherence length of the diffracted X-radiation at the specimen plane will not be smaller than one half the longitudinal coherence length of the Xray beam available at the aforesaid X1 beam port. The values 0.876 cm for d and and 9.12 μm for D are called ideal values of d and D. The ideal values of d and D will henceforth be labelled d* and D*.

More generally, ideal values d* and D* can be calculated for any uniform monochromatic Xray beam intended for collimation. At the preselected wavelength, λ, of said Xray beam, these ideal values are the unique values of d and D that ensure both that the transverse coherence length of the X-radiation at the specimen plane be not less than one half the longitudinal coherence length of the incident uniform monochromatic Xray beam at the preselected wavelength and also that the focal spot of an optimal pupil coincide with the specimen coherence circle. Any pupil constructed so as to realize the values d* and D* ideal for a monochromatic Xray beam will be called the pupil ideal for that monochromatic Xray beam, or, when no amibiguity can arise, simply the ideal pupil.

Figure 7:
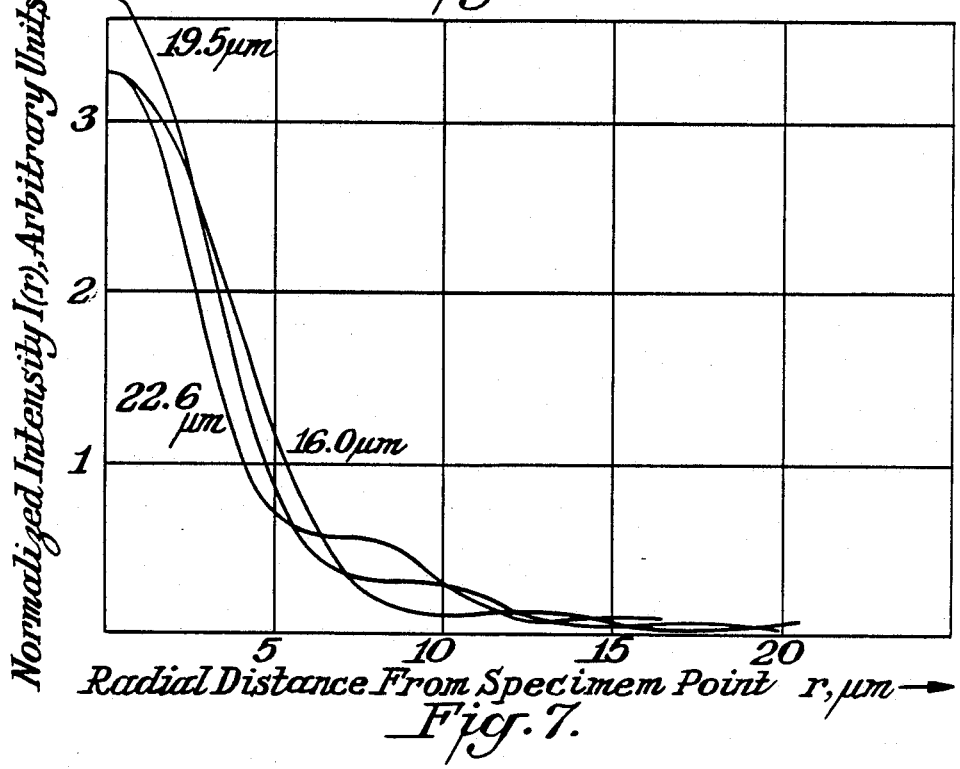
FIG. 7 is a plot of several curves, each representing a possible behavior of the intensity function I(r) versus distance r.

For any pupil illuminated by a monochromatic Xray beam, an intensity curve can be constructed that represents the distribution of intensity of the diffracted X-radiation incident upon a plane behind it. Thus the comparison of several pupils, each intended for operation at one and the same pupil-to-specimen distance, can be carried out graphically by successively constructing, against a common set of axes, the intensity curve for any one pupil, then the intensity curve for any other, and so on, until there are as many curves as there are pupils to be compared. It would be convenient to label any intensity curve by the diameter of the pupil to whose operation it referred. A set of such intensity curves pertaining to $\lambda = 3.2$ nm and d=4.0 cm is shown in FIG. 7. At values of r larger than were convenient to show in the Figure, the curves shown become asymptotic to the axis of abscissae. The curve labelled 19.5 μm in FIG. 7 is identical with the curve of FIG. 6.

The data plotted in FIG. 7 have been calculated with the help of the Huygens-Fresnel-Kirchhoff diffraction integral as given, for instance, in equation (4-10) of the book by J. W. Goodman, *Introduction to Fourier Optics*, San Francisco, McGraw-Hill, 1968. A pupil of diameter a is simulated by taking the function $U(x_1, y_1)$ that appears in said equation to have the value unity when $x_1^2 + y_1^2 < a^2$ and the value zero otherwise. The quantity z in said equation was given the value 4.0 cm, and the quantity k in said equation has the meaning of $2\pi/\lambda$ and was given the value $2\pi/3.2$ nm$^{-1}$. The curve labelled with any value of a in FIG. 7 is obtained by dividing by $(\pi/4)a^2$ the square of the modulus of said diffraction integral, the value of the integral itself having been calculated numerically by Simpson's rule. In this way the several curves for different values of a are made to represent one and the same value for the total energy contained in the diffracted X-radiation incident upon the specimen plane, and the intensity curves are accordingly said to be normalized. The calculations have been given in detail in a private unpublished memorandum by the applicant. The dashed vertical line that intersects the axis of abscissae in FIG. 7 indicates the radius of the optimal pupil's focal spot, and it can be seen from the Figure that at most r-values smaller than that radius, the normalized intensity is higher when a=19.5 μm than for any other value of a.

It may be noted in connection with eq. (4-10) of said book by Goodman that the expression given in the integrand is an approximation valid so long as $\lambda << a << z$. The approximation is therefore well justified in connection with the values used in applicant's unpublished calculations. The scaling rule given hereinabove, as well as the wavelength rule to be introduced hereinbelow, are both consequences of said eq. (4-10) and, therefore, similarly approximate in their application. It should be understood that wherever the present disclosure depends upon the validity of said scaling rule or said wavelength rule or upon these two rules in combined form, as exemplified by the generalized scaling rule to be introduced hereinbelow, the range of values used or contemplated is consistent with the requirements of said approximation.

The monochromatic irradiance at wavelength λ of a pupil placed in a monochromatic incident Xray beam at preselected distance d from the specimen plane is defined as the energy of the diffracted X-radiation that falls within the focal spot of an optimal pupil, divided by the total energy of the diffracted X-radiation incident upon the specimen plane. When weighted by the values of r to which they correspond and replotted, the data shown in two of the curves of FIG. 7 yield the curves shown in FIG. 8. The curves of FIG. 8 become asymptotic to the axis of abscissae at values of r larger than conveniently shown in the Figure. The area of the planar surface bounded above by either of these curves and also bounded below by the axis of abscissae corresponds to the total energy of the diffracted X-radiation incident upon the specimen plane divided by the energy of the collimated Xray beam, $(\pi/4)a^2I_o$. It can be seen by inspection that said area has the same value for one curve as for the other, it being recognized that several percent. of either area lies beyond the right hand edge of the Figure. If one of these planar surfaces is now separated into two parts by a vertical line that transects the axis of abscissae at 3.4 μm, which is the value of the radius of the focal spot of an optimal pupil, then the area of that portion of the original planar surface that lies to the left of the vertical line, divided by the area of the original planar surface, represents the monochromatic filling factor of the corresponding pupil.

Figure 8:
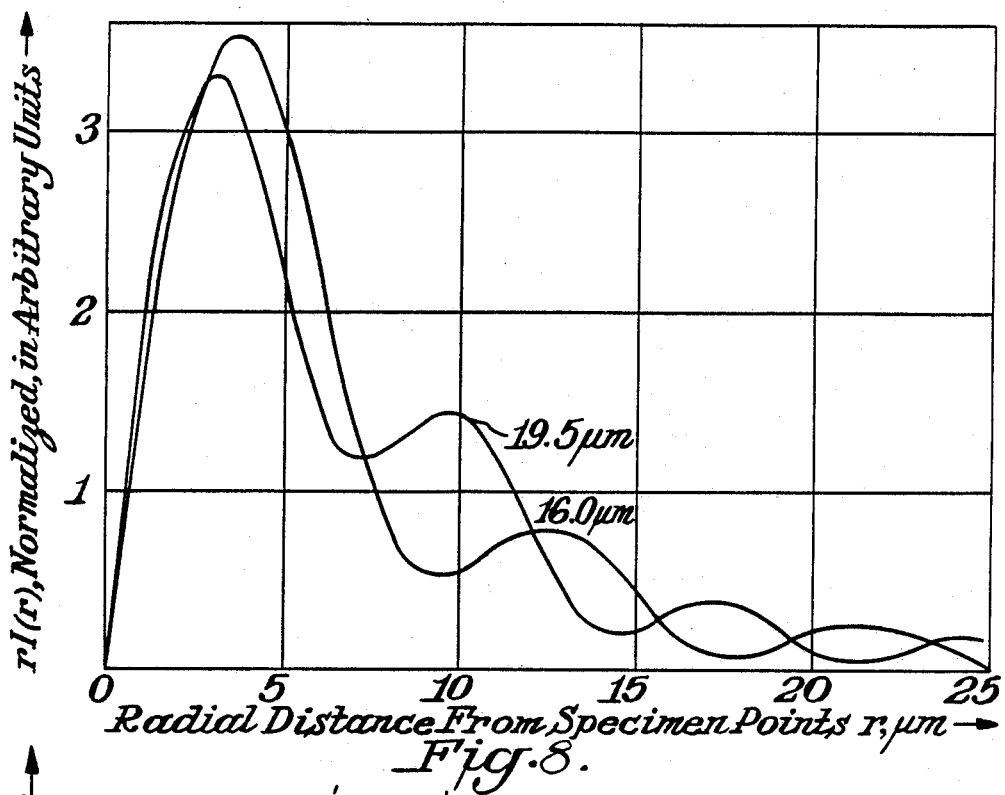
FIG. 8 is a plot of two curves, each representing a possible behavior of the function rI(r) versus distance r.
Figure 9:
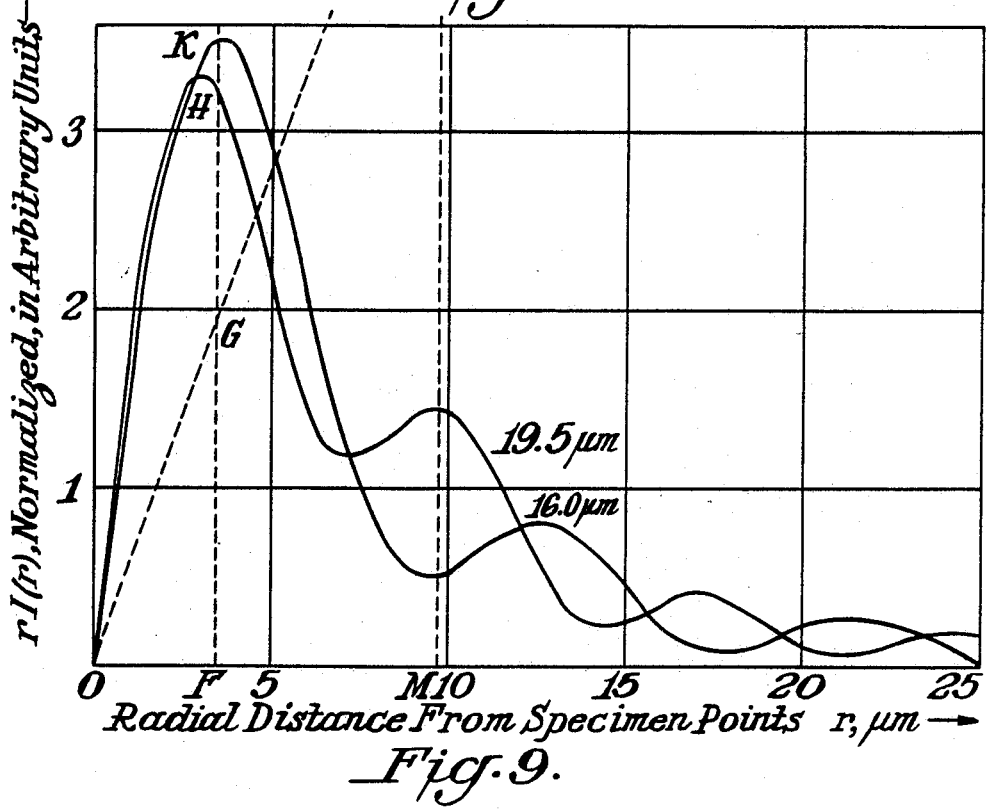
FIG. 9 is a version of FIG. 8 to which new features have been added.

Referring to FIG. 9, the origin of coordinates is denoted by O, and there have been added to the contents of FIG. 8 an oblique dashed line OG that represents a portion of the data originally plotted as the horizontal dashed line in FIG. 6, a vertical line that intersects the axis of abscissae at point F, 3.4 μm from the origin, and a vertical line that intersects the axis of abscissae at point M, 9.75 μm from the origin. Were the line OG produced beyond G until it intersected the latter vertical line at a point L, which intersection, however, is not shown in the Figure, then the area of the triangle OLM would be the same as the area enclosed between either curve and the axis of abscissae. The intersections of the former vertical line with the oblique dashed line, with the curve labelled 19.5 μm, and with the curve labelled 16.0 μm are denoted by G, H, and K, respectively. The area of the planar surface OHF represents the monochromatic irradiance at λ=3.2 nm of the pupil of diameter 19.5 μm, and the area of the planar surface OKF represents the monochromatic irradiance at 3.2 nm of the pupil of diameter 16.0 μm. In similar fashion, the area of the triangle OGF represents the monochromatic irradiance at λ=3.2 nm that the optimal pupil of would have if the X-radiation it diffracted obeyed not the laws of wave optics, but the laws of geometrical optics. In such hypothetical case, the monochromatic irradiance can be calculated by elementary means and has the value given by the ratio of the area of triangle OGF to the area of triangle OLM, to which triangle OGF is similar. Said ratio is the fraction whose denominator is the square of the diameter of the optimal pupil and whose numerator is the square of the diameter of the focal spot of the optimal pupil, or $(2\times 3.42 \mu m)^2/(19.5 \mu m)^2=0.123$. It can be seen by planimetric comparison of the area of triangle OGF with the area of the planar surface OHF that at λ=3.2 nm, the monochromatic irradiance of the pupil of optimal diameter, 19.5 μm, is 0.30, and by comparison of the area of triangle OGF with the area of the planar surface OKF that the value of the monochromatic irradiance of the pupil of diameter of 16.0 μm is 0.28.

In a fashion exactly parallel to the procedure used hereinabove, intensity data I(r) can be calculated for a specimen plane 4.0 cm distant from any pupil illuminated by a uniform Xray beam of wavelength 3.2 nm; and the curve representing I(r) versus r and the curve representing rI(r) versus r can be constructed, whence the monochromatic irradiance at wavelength 3.2 μm of that pupil can be found by graphical means. In addition, the monochromatic irradiance at wavelength 3.2 μm of a pupil of any desired diameter a', referred to a specimen plane at any desired distance d' behind the pupil, can be obtained. In consequence of the scaling rule stated hereinabove, said monochromatic irradiance will have the same value as the monochromatic irradiance of a pupil of diameter Qa' in the specimen plane 4.0 cm behind it, where Q=√(d'/4.0 cm), the monochromatic irradiance of the pupil of diameter Qa' being given according to the procedure already described. By such methods it can be shown, for pupil-to-specimen distance 4.0 cm, that the monochromatic irradiance at wavelength 3.2 nm of an optimal pupil is as least as large as 93% of the largest possible monochromatic irradiance at wavelength 3.2 nm of a pupil having pupil-to-specimen distance 4.0 cm.

More generally, the monochromatic irradiance of any pupil at any wavelength and for any pupil-to-specimen distance can be obtained either directly, by a set of new calculations like those already given hereinabove, excepting that the values of wavelength, pupil diameter, and pupil-to-specimen distance are those that pertain to such general situation, or indirectly, through a wavelength rule, in terms of the calculated values already given. The following wavelength rule has been shown mathematically by the applicant, in a private unpublished memorandum, to apply to diffraction by a circular pupil: Let the incident uniform monochromatic Xray beam have wavelength λ, and let the pupil have diameter a, and let f(r) represent the distribution of intensity of the diffracted X-radiation in the plane that transects the collimator axis at a distance s behind the pupil, wherein the independent, non-negative variable r represents, when greater than zero, the distance from a point not on the collimator axis to the nearest point upon the collimator axis. If the wavelength be increased by the factor P, then the distribution of intensity of the diffracted X-radiation in a plane at distance s/P behind the pupil will be given by the function h(r)=f(r).

In combination with the wavelength rule, the scaling rule stated hereinabove permits the referral of the intensity distribution I(r) known for a given Xray wavelength λ and a given pupil diameter a in a specimen plane at given pupil-to-specimen distance d to be referred to a new wavelength λ'=Pλ, a new pupil diameter a'=Qa, and a new specimen specimen plane at pupil-to-specimen distance $d'=(Q^2/P)d$. Conveniently, if it is desired to know at wavelength' for a pupil of diameter a' the distribution I'(r) of intensity of the diffracted X-radiation in a specimen plane at pupil-to-specimen distance d', that distribution I'(r) will be given in terms of the distribution I(r) obtainable by the methods given hereinabove, or otherwise known to apply at pupil-to-specimen distance d when the wavelength is λ. The value of the diameter of the pupil associated with said distribution I(r) will be $$a=a'\sqrt{(\lambda d/\lambda' d')};$$

and required relation between I'(r) and the said distribution I(r) is $$I'(r)=(\lambda d/\lambda' d')I(r\sqrt{(\lambda d/\lambda' d')}).$$

This pair of relations comprise what is called the generalized scaling rule. Once said distribution I'(r) has been found, a curve of I'(r) versus distance r from the specimen point can be plotted. A vertical line can be drawn that intersects said curve and that also intersects at abscissa $1.72\sqrt{(\lambda' d')}$ the axis of abscissae against which said curve has been plotted. Planimetric analysis like that already given can then be employed to obtain the value of the monochromatic irradiance at wavelength λ' of the pupil of diameter a'.

Proceeding in such fashion it can be shown that at any preselected wavelength λ, and for any selected value of the pupil-to-specimen distance d, the monochromatic irradiance of a pupil whose diameter has the optimal value $1.72\sqrt{(\lambda d)}$ is at least 93% as great as the monochromatic irradiance of any pupil working at the same preselected value of the wavelength and at the same preselected value of the pupil-to-specimen distance; and, furthermore, that under said conditions no pupil whose diameter exceeds the optimal diameter has a monochromatic irradiance greater than that of an optimal pupil; and, furthermore, that under said conditions no pupil whose diameter has a value less than 81% of the optimal diameter has a monochromatic irradiance greater than that of an optimal pupil.

The monochromatic filling factor at wavelength λ of any pupil, of diameter a, working at preselected wavelength and preselected pupil-to-specimen distance d is defined as the fraction of the energy of the diffracted X-radiation that falls within the specimen coherence circle, divided by the total energy of the diffracted X-radiation incident upon the specimen plane. If a and d are chosen to have the ideal values D* and d*, respectively, then the pupil will be an ideal pupil at the preselected wavelength, and at said preselected wavelength its monochromatic filling factor will have the same value as its monochromatic irradiance. From this fact it follows that the monochromatic filling factor of an ideal pupil will be at least 93% as great as the monochromatic filling factor of any pupil working at the ideal pupil-to-specimen distance, and at the same preselected value of the wavelength of the incident Xray beam; and, furthermore, that under these same conditions no pupil whose diameter exceeds the ideal diameter has a monochromatic filling factor greater than that of the ideal pupil; and, furthermore, that under these same conditions no pupil whose diameter has a value less than 81% of the ideal diameter has a monochromatic filling factor greater that that of an ideal pupil.

Figure 10:
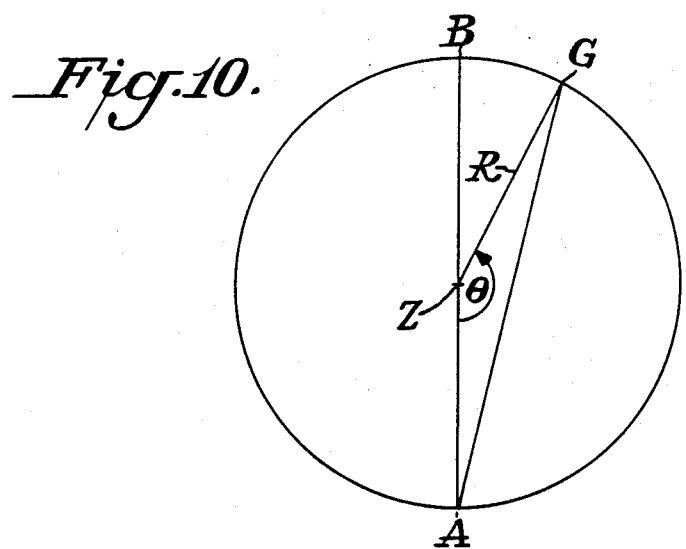
FIG. 10 is a portion of a vibration curve for circular division of a wavefront, to which symbols, radii, and a chord have been added.
Figure 18:
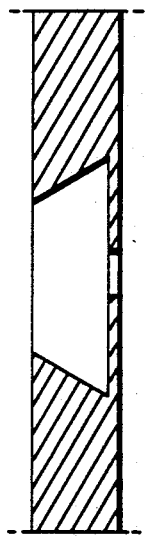
FIG. 18 is an axial cross-section of a lens. Xray opaque material is cross-hatched.

A quantity closely related to the monochromatic filling factor at wavelength λ of any pupil is the monochromatic diffraction efficiency of the pupil, defined as the intensity of the diffracted X-radiation at the preselected specimen point divided by the total energy of the collimated Xray beam. The monochromatic diffraction efficiency at wavelength λ will be denoted by $\epsilon(\lambda)$, or simply $\epsilon$ when no ambiguity can arise. Then for any pupil at any preselected wavelength, $\epsilon$ has the same meaning as $I(O)$. The value of $\epsilon$ can be found by an elementary graphical calculation that requires no integration. The calculation begins with the vibration curve for circular division of the wavefront transmitted by the pupil as given, for example, in FIG. 18J, p. 387 of said book by Jenkins and White. A portion of the outermost volute of said vibration curve is given in FIG. 10; it is very nearly a circular arc centered at the point Z. Also shown in FIG. 10 are a pair of radii and a chord that define a central angle θ. The length of the chord can be shown from elementary trigonometry to have the value $2R \sin[\theta/2]$, where R is the radius of the arc. As shown in the said book by Jenkins and White, the vibration curve spirals only very gradually inward towards the point Z.

The length of the chord between A and G represents the amplitude, or, alternately the square root of the intensity, of the X-radiation diffracted to the specimen point subsequent to passage of the monochromatic incident Xray beam through a pupil of diameter a. The meanings of the other parts of the vibration curve are as follows. An infinitesimal portion of the arc adjacent to point A represents the contribution to the amplitude of the diffracted X-radiation at the specimen point that is furnished by the portion of the Xray wavefront most immediately adjacent to the center of the pupil. This contribution will be called the central contribution. An infinitesimal portion of the arc adjacent to G and lying within the angle θ represents the contribution to the amplitude of the diffracted X-radiation at the specimen point that is furnished by the portion of the Xray wavefront that passes just inside the edge of the pupil. This contribution will be called the marginal contribution. The central angle θ separating sad infinitesimal portions of the arc is equal to the difference between the phase angle with which the marginal contribution arrives at said specimen point and the phase angle with which the central contribution arrives at said specimen point. When θ reaches precisely π radians, the pupil's edge is precisely one half-wavelength more distant from the specimen than is the pupil's center, and the pupil subtends precisely one Fresnel half-wavelength zone at said specimen point. The zone number of a pupil is defined as the angle θ divided by π; and if the zone number has value m, then the pupil is said to subtend m Fresnel half period zones at said specimen point. The zone number can be any positive number and is not restricted to integral values. The relation between the zone number, m, and diameter a of the pupil, the wavelength λ, and the pupil-to-specimen distance d assumes a simple form when, as in the present case, the source of X-radiation lies very far away from the collimator. The relation is $m = a^2/4\lambda d$. (Apart from notation, this relation is essentially the same as expressed by the first of the equalities in equation (18i), p. 386 of said book by Jenkins and White.) Correspondingly, $\theta = \pi a^2/4d$. The length of the line AZ in FIG. 10 represents the amplitude, or alternately the square root of the intensity, of the diffracted X-radiation received at a point on the collimator axis at which the pupil subtends an exceedingly large number of zones, as, for instance, when the point lies very nearly in the plane of the pupil itself. In such a case the intensity of the X-radiation at said point is very nearly uninfluenced by the pupil, and must be substantially the same as the intensity $I_o$ of the X-radiation incident upon the collimator itself. The amplitude of the X-radiation at a point on the collimator axis at which the pupil subtends one Fresnol zone would be given by the diameter AB in FIG. 10. The square of this length being very nearly four times the square of the radius AZ, intensity of the X-radiation at a point at which the pupil subtends one Fresnel half-period zone is very nearly 4 times the intensity of the Xray beam incident upon the collimator itself. An intensity only slightly smaller than this would occur at that axial point at which the pupil sub-tends three Fresnel half wavelength zones. In this case $\theta = 3\pi/2$, and the length of the chord that spans this angle is just sligthly less than the diameter AB in FIG. 10. At that axial point at which the pupil subtends precisely two Fresnel half-wavelength zones, the intensity will be very nearly zero. And similarly, if the number of Fresnel half-wavelength zones subtended by the pupil at the speciment point is an integer not very much larger than unity, the intensity of the diffracted X-radiation at the specimen point will be very nearly $4I_o$ if said integer is odd and very nearly zero if said integer is even.

As indicated hereinbefore the vibration curve spirals only very gradually towards the point Z, and so its radius R is affected very little by changes not much larger than unity in the value of the zone number $m = \theta/\pi = a^2/4\lambda d$ or, equivalently, by such changes in a that are not so large as to change m by much more than unity. Consequently, R will be affected very little by small changes in pupil diameter a, and may be taken to be constant so long as the value of m given by this expression is not very much larger than unity. This fact, in combination with the result obtained in the paragraph immediately preceding, is sufficient basis to determine the monochromatic diffraction efficiency of any pupil. In terms of quantities appearing in FIG. 10, the monochromatic diffraction efficiency is equal to the square of the length of chord AG, $4R^2 \sin^2[\theta/2]$, divided by the value $(\pi/4)a^2 I_o$. Since $\theta$ itself is given in terms of a by $\pi a^2/4\lambda d$, the monochromatic diffraction efficiency can be written $$\epsilon(\lambda) = (16R^2/\pi a^2 I_o) \sin^2(\pi a/8\lambda d),$$

where R, can be regarded as very neatly independent of a over the range of value that a will assume in the present discussion.

When R is nearly independent of a, the quantity $F = (4\pi I_o d/16R^2)\epsilon$ is, in essence, proportional to $\epsilon$. The quantity F is called the monochromatic figure of merit of the pupil. It is given in terms of a, d, and $\lambda$ by:

$$F = (4\pi\lambda d/a^2) \sin^2(\pi a^2/8\lambda d) = (4/m) \sin^2(m\pi/2),$$

it being understood that the expression applies so long as m is not very large in comparison to unity. The figure of merit of a pupil having zone number 1 is 4, and the figure of merit of a pupil having zone number 3 is 4/3. The figure of merit of a pupil having zone number 2 is zero, in correspondence with the fact that X-radiation diffracted from such a pupil has very nearly zero intensity at the specimen point. When the zone number of a pupil is not very much larger than unity, the monochromatic diffraction efficiency of the pupil is very nearly equal to its figure of merit.

Figure 11:
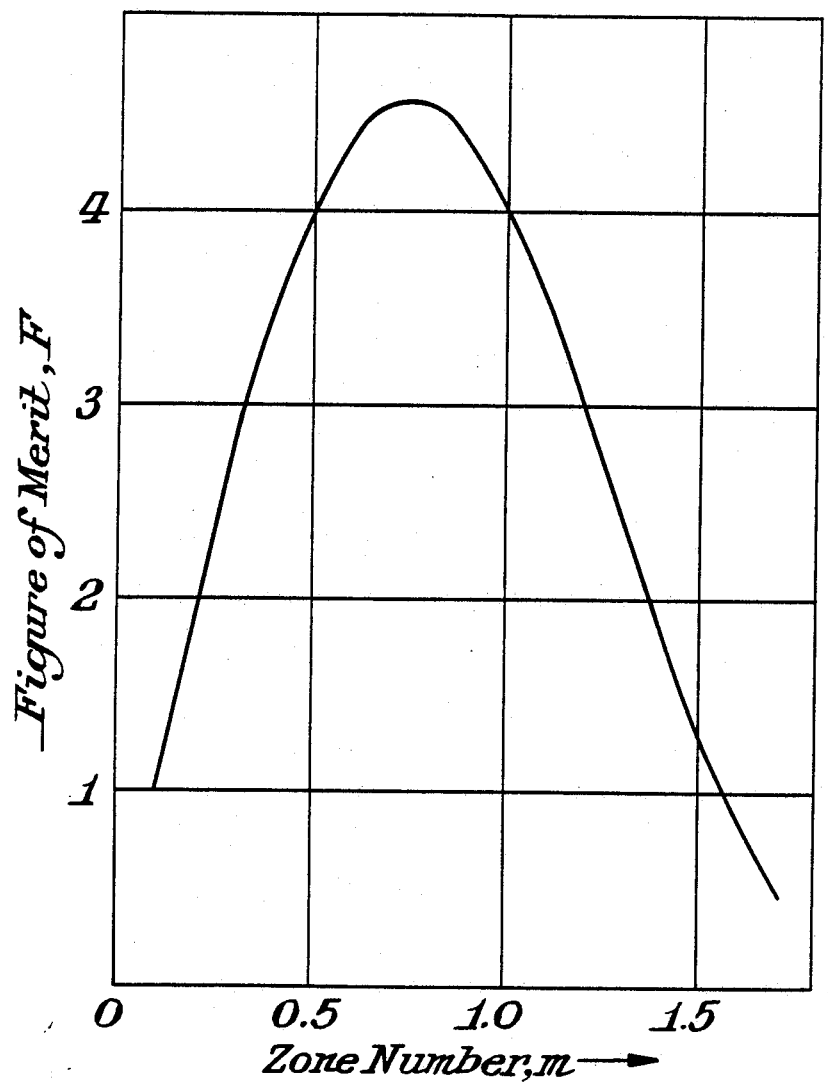
FIG. 11 is a plot of a curve representing pupil figure of merit versus zone number, which parameter is dimensionless.

The questions now arise: what zone number produces the highest pupil figure of merit, and to what a value of a does said zone number correspond? The answer can be found by scanning a plot of F versus m. Such a plot is presented in FIG. 11, and it is readily seen that the highest pupil figure of merit occurs when m is close to 0.74. A more exact value of m is obtained according to the principles of differential calculus, which show that F will be maximized when m satisfies the equation $m\pi = \tan(m\pi/2)$. One of the positive solutions of this equation corresponds to the absolute maximum of the pupil figure of merit. Given to fix figures of precision, the solution is m=0.742020. The corresponding figure of merit is 4.55, and the corresponding value of the pupil diameter is $1.72281\sqrt{(\lambda d)}$, which value is identical with the optimal diameter D given hereinabove. The monochromatic figures of merit calculated at $\lambda = 3.2$ nm and d=4.0 cm for pupils of diameter 16.0 μm, 19.6 μm, and 22.6 μm are 4.00, 4.55, and 4.00. These numbers stand in good proportion to the heights I(O) at which the intensity curves plotted in FIG. 7 reach the axis of ordinates. The discussion given so far has referred to the pupil of a collimator intended to concentrate upon the specimen coherence circle a monochromatic incident Xray beam of preselected wavelength. The concentration is nearly maximized when, at the preselected wavelength, the pupil is an ideal pupil. The ideal pupil has the maximum monochromatic figure of merit possible for any pupil and, among all pupils that achieve the maximum monochromatic figure of merit, at the preselected wavelength exactly and uniquely covers with its focal spot the specimen coherence circle. If the preselected wavelength is never to be changed, considerable latitude of choice remains possible in the values of the pupil diameter, a, and the pupil-to-specimen distance, d. Analysis of the kind already given in connection with FIGS. 7 and 8 will show that, if d=d* and a is chosen anywhere within the range $0.81 D^* \leq a \leq D^*$, the value of the monochromatic filling factor will be found to be not less than 0.28 nor greater than 0.31; that is to say, that the monochromatic filling factor will not vary from that of an ideal pupil by more than 7 parts in one hundred and will not vary from the maximum possible monochromatic filling factor by more than 10 parts in one hundred. The same kind of analysis, augmented by appeal to the scaling rule given hereinabove, will show that if, alternately, a=D* and d is chosen anywhere within the range $d^* \leq d \leq 1.52 d^*$, the monochromatic filling factor will likewise be found to be not less than 0.28 nor greater than 0.31. Another set of conditions that ensures that the monochromatic filling factor will lie between 0.28 and 0.31 is a=0.90 D*, and d chosen anywhere within the range $0.90 d^* \leq d \leq 1.23 d^*$.

A more general way of formulating the range of permissible choices of a and d would allow both quantitities simultaneously to be uncertain. Any pupil whose diameter a and distance d from the specimen plane satisfy the inequality $$[(a - D^*)/D^*]^2 + [(d - 1.23 d^*)/(2.21 d^*)]^2 \leq 0.01$$

will have a monochromatic filling factor not smaller than 0.28 and a figure of merit not smaller than 4.45 and will satisfy in addition the requirement that the transverse coherence length of the collimated Xray beam at the specimen point be not less than half as great as the longitudinal coherence length of the incident Xray beam at said value of the preselected wavelength.

A continuation of the same kind of analysis shows, moreover, that either the monochromatic figure of merit or the monochromatic filling factor of a pupil, or both quantities simultaneously, will be reduced below nine tenths of their maximum values by any choice of a and d that lies well outside any of the four sets of ranges given hereinabove. Preliminary design values of a and d are therefore chosen close to the ideal values. The design values a=D*, d=1.23 d* would allow a practical collimator to achieve at the design wavelength a monochromatic filling factor that comes within 10 parts in one hundred of of the maximum possible, while nonetheless permitting simultaneously a tolerance of ±9% both in the realization of pupil diameter and in the realization of pupil-to-specimen distance.

It may be the case that a particular specimen to be studied in a monochromatic Xray beam will have a specimen diameter smaller than the diameter of the specimen coherence sphere. If every specimen to be studied in the Xray beam is such a specimen, then yet other values of d and a, smaller than the ideal values given hereinabove but chosen, analogously, in order to bring into equality the specimen diameter and the diameter of the focal spot of an optimal pupil, would be preferred as preliminary design values. To find such preferred values of d and a no change in the design procedure given hereinabove is required, except that in any calculation or expression requiring the value of the longitudinal coherence length of the incident monochromatic Xray beam, twice the value of the diameter of the largest specimen is to be substituted therefor. The value of the longitudinal coherence length of the monochromatic incident Xray beam is denoted by L, and the diameter of the largest specimen to be examined is denoted by t. Thus, if 2t>L, the value of the diameter of the ideal pupil is given by D*=1.4250 L, and the value of the ideal pupil-to-specimen distance is given by $d^* = 0.6842\, L^2/\lambda$. If $2t < L$, the preferred value of the diameter of the pupil is denoted by $D_p$ and is given by $D_p = 2.850\, t$, and the value of the preferred pupil-to-specimen distance is denoted by $d_p$ and is given by $d_p = 2.737\, t^2/\lambda$. A pupil whose diameter is has the value $D_p$ and whose pupil-to-specimen distance has the value $d_p$ is called the monochromatically preferred pupil at wavelength $\lambda$.

Let it be supposed now that a collimator is to be designed whose operation is intended to focus upon a specimen of diameter t as large a fraction of the energy of the collimated Xray beam as is possible. By the phrase, specimen of diameter t, is now to be understood either a small object to be placed at the specimen point and having a specimen diameter t, or a region of diameter t in the external surface of an extended object that occupies a portion of the space behind the pupil and whose external surface is tangent to the specimen plane at the specimen point. The circle that lies in the specimen plane, whose center coincides with the specimen point, and whose diameter has value t is called the target circle. The focal efficiency of any collimator is defined as the total energy of the diffracted X-radiation that falls within the target circle, divided by the total energy of the diffracted X-radiation incident upon the specimen plane. If the incident Xray beam is monochromatic and has wavelength $\lambda$, and if the collimator realizes the properties of a monochromatically preferred pupil at wavelength $\lambda$, then the focal spot of that monochromatically preferred pupil coincides with the target circle, and the focal efficiency of the collimator is 0.30.

When the incident Xray beam is not monochromatic, the focal efficiency of a collimator cannot be specified in a way that is independent of the composition of the incident Xray beam. Let it be supposed that an incident Xray beam, if decomposed by a monochromator into monochromatic components, would be found to contain a component at each wavelength value within the range $\lambda_1 \leq \lambda < \lambda_2$, and would be found also to contain no component whose wavelength value lay outside this range. Such an Xray beam is called a composite Xray beam. The bandwidth of said composite Xray beam is defined as the value $\lambda_2 - \lambda_1$, and the mean wavelength of said composite Xray beam is denoted by $\lambda_o$ and defined as the wavelength whose value is the mean proportional between $\lambda_1$ and $\lambda_2$: $\lambda_o = \sqrt{(\lambda_1 \lambda_2)}$. If each of the components present in a composite Xray beam has the same energy as any other, said composite Xray beam is called a white Xray beam. The focal efficiency of a collimator intended for operation in a white incident Xray beam can be stated in a way that depends only upon the bandwidth and the mean wavelength of the beam or, alternately, only upon the values $\lambda_1$ and $\lambda_2$. The focal efficiency of a collimator so intended is denoted by E.

Let a collimator design be sought that yields the maximum focal efficiency possible in a white incident Xray beam of mean wavelength $\lambda_o$ and bandwidth $0.388\, \lambda_o$. An alternate description of the white incident Xray beam would assign to it the values $\lambda_1 = 0.825\, \lambda_o$ and $\lambda_2 = 1.212\, \lambda_o$. Said maximum possible focal efficiency will be very nearly achieved by a collimator whose design realizes the properties of a monochromatically preferred pupil at wavelength $\lambda_p = 0.825\, \lambda_o$. This can be seen by application of the generalized scaling rule in conjunction with graphical analysis like that given hereinabove. In said application d and d' are both to be taken equal to $d_p$, which under the present supposition must have the value $d_p = 2.737\, t^2/(0.825\, \lambda_o) = 3.32\, t^2/\sqrt{(\lambda_1 \lambda_2)}$. Then at the mean wavelength $\lambda_o$, said monochromatically preferred pupil will subtend $(D_p/2)^2/(\lambda_o d_p) = (1.4250\ t)^2/(2.737\ t^2/0.825) = 0.612$ Fresnel half-wavelength zones at the specimen point. At wavelength $\lambda_1$ the same pupil will subtend at the same specimen point not fewer than $0.612\sqrt{(\lambda_o/\lambda_1)} = 0.505$ Fresnel half-wavelength zones; and at wavelength $\lambda_2$ the pupil will subtend at the same specimen point not more than 0.742 Fresnel half-wavelength zones. Intensity curves for zone numbers 0.505 and 0.742 have already been found and are represented by the curves labelled 16.0 μm and 19.5 μm in FIGS. 7 and 8. Planimetric measurements on FIG. 8 have already shown the monochromatic irradiance of a pupil that subtends 0.505 zone at the specimen point to have the value 0.28 and the monochromatic irradiance of a pupil that subtends 0.742 zone at the specimen point to have the value 0.30. It can be established by similar procedure that over the range $0.505 \leq m \leq 0.742$, the monochromatic irradiance of a pupil of zone number m is bounded below by 0.28 and is bounded above by 0.31 and that the absolute maximum monochromatic irradiance of any pupil occurs at zone number close to 0.612, which value is also the zone number at wavelength $\lambda_o$ of said monochromatically preferred pupil.

If a monochromatic Xray beam of wavelength $\lambda$ is incident upon a collimator whose pupil is said monochromatically preferred pupil, then the focal efficiency of the collimator will have the same value as the monochromatic irradiance at wavelength $\lambda$ of said monochromatically preferred pupil; and, respecting the monochromatic component at wavelength $\lambda$ of a comparative Xray beam incident upon the collimator, the focal efficiency of the collimator will have the same value as the monochromatic irradiance at said wavelength $\lambda$ of said monochromatically preferred pupil. Since over the wavelength range $0.825\, \lambda_o \leq \lambda \leq 1.212\, \lambda_o$ that defines the composition of said incident white Xray beams, the monochromatic irradiance of said monochromatically preferred pupil is bounded from below by 0.28 and is bounded from above by 0.31, the focal efficiency of said collimator respecting said incident white Xray beam will be bounded from below by 0.28 and bounded from above by 0.31. The focal efficiency of a collimator respecting an incident white Xray beam whose bandwidth does not exceed 39% of its mean wavelength can therefore be made practically as high as the maximum focal efficiency possible for any collimator operating in an incident Xray beam that is monochromatic.

Figure 12:
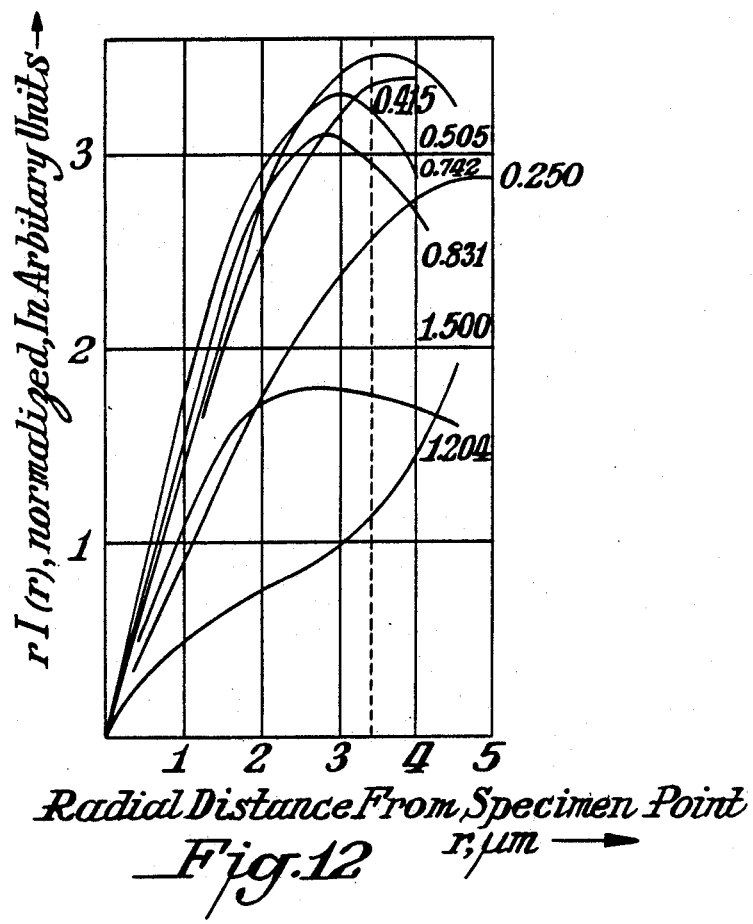
FIG. 12 is a plot of several curves of which each represents a portion of the possible behavior of the function rI(r) versus distance r.

Let it now be supposed that collimator's focal efficiency is to be maximized with respect to an incident white Xray beam whose composition ranges over the complete octave whose longest wavelength has value $\lambda_2 = 2 \cdot \lambda_1$. Then $\lambda_o = \sqrt{2}\lambda_1$ and the bandwidth $B = \lambda_o/\sqrt{2}$. A design procedure like that used immediately hereinabove is again convenient. In terms of such procedure, two zone numbers are required whose ratio is 2:1 and for which the corresponding monochromatic irradiances are very nearly equal. One of the two zone numbers must be greater than 0.612, and the other zone number must be smaller. A graphical analysis can again be carried out upon plots that represent the paraxial portions of the normalized intensity curves rI(r) of selected pupils. A set of such plots is given in FIG. 12. Like the curves of FIG. 8, the intensity curves are all appropriate to pupil-to-specimen distance 4.0 cm. In FIG. 12 the curves labelled 0.505 and 0.742 are portions of the curves already given in FIG. 8 and labelled therein by 16.0 μm and 19.5 μm, respectively; and the dashed vertical line in FIG. 12 that intersects these curves at abscissa 3.42 μm corresponds to the edge of the focal spot of an optimal pupil, the optimal pupil having in this case the value 19.5 μm. However, the interpretation to be given to the curves of FIG. 12 is not the same as that given to FIG. 8. In FIG. 12 the curves have been labelled with Fresnel half-wavelength zone numbers, and all of the curves refer to one and the same pupil, whose operation at various wavelengths is now under study. The area of the planar surface bounded from above by the curve labelled 0.742, bounded from the right by said dashed vertical line, and bounded from below by the axis of abscissae represents the monochromatic filling factor of the pupil at the wavelength at which it is an optimal pupil. The area of the planar surface bounded from above by any other curve, bounded from the right by said dashed vertical line, and bounded from below by the axis of abscissae then represents the monochromatic filling factor of the pupil at the wavelength at which it subtends at the specimen point the number of Fresnel half-wavelength zones indicated by the label of said other curve. It can be seen that the areas for the curves labelled 0.830 and 0.415 are very nearly equal, and also that the latter area is smaller than the area for the curve that would represent a pupil having a preselected zone number lying between 0.415 and 0.831. The mean proportional of these numbers therefore can be used to determine the wavelength $\lambda_p$ at which a monochromatically preferred pupil should have its maximum monochromatic irradiance. The monochromatic irradiance of such a pupil will exceed 0.26 over the entire range of wavelengths that comprise the octave that extends from $\lambda_1 = \lambda_o/\sqrt{2}$ to $\lambda_2 = \sqrt{2}\lambda_o$; and, respecting a white incident Xray beam of composition defined by said octave, the focal efficiency of any collimator that realizes the properties of a pupil monochromatically preferred at wavelength $\lambda_p = 0.791 \lambda_o$ will have a focal efficiency not smaller than the lowest value of the monochromatic irradiance of said monochromatically preferred pupil at a wavelength chosen from said octave. Said lowest value being 0.26, the focal efficiency of any such collimator will be not smaller than 0.26. A lower bound yet greater than this can be established by numerical integration to be 0.28, approximately.

The intent of the ideal collimator designs given most immediately hereinabove is to focus into a circular target of specified size as much as possible of the energy of a white incident Xray beam. Such intent accords with the requirements of photolithography, in which there arises as well the corollary need of screening from irradiation the regions of a substrate that lie outside the target region. In the conceptually simplest screening procedure a pinhole collimator is interposed between the source of Xrays and the target region of the substrate, which lies immediately behind the pinhole, at pupil-to-specimen distance as close to zero as mechanical construction will allow. The pupil diameter has very nearly the same value as the diameter of the target region, and the energy of the collimated Xray beam incident upon the target circle is $\pi(t^2/4)I_o$. A more effective procedure would be to use two collimators coaxially in tandem. The collimator lying closer to the source of Xrays, called the primary collimator or the primary element, will be designed to maximize the efficiency with which the incident Xray beam is focussed upon the target circle, and the collimator lying closer to the substrate could be a pinhole collimator whose pupil has nearly the same diameter as the target region and whose purpose is to shield the remainder of the specimen plane from the halo surrounding the primary collimator's focal spot. Such a tandem collimator is called a lens. The pupil of the primary collimator is called the primary pupil of the lens. The distance between the primary pupil and the specimen plane is called the focal distance of the lens. The collimator lying closer to the substrate is called the secondary element of the lens, and its pupil is called the secondary pupil of the lens. The distance between the secondary pupil and the specimen plane is called the working distance of the lens. The working distance is denoted by $d_s$.

The secondary pupil will, of course, diffract the X-radiation passing through it. However, by analysis like that already used in connection with FIGS. 8 and 12, it can be shown that if the working distance is smaller than $D_s^2/8\lambda_o$, wherein $D_s$ designates the diameter of the secondary pupil, then very little of X-radiation reaching the specimen plane will fall outside the geometrical shadow of the secondary pupil; i.e., outside the target circle. If $\lambda_o = 3.2$ nm and $D_s = 0.32$ μm, for instance, $d_s$ need only be smaller than 4 μm in order to ensure that the aberrant portion of the collimated beam will contain less than 10% of the total energy of the collimated beam. The energy of the collimated Xray beam incident upon the target circle can then be practically as high as $\pi E(D_p^2/4)I_o$, where E is the focal efficiency of the primary element and $D_p$ is the diameter of the monochromatically preferred pupil whose properties the primary element is intended to realize. The ratio of the energy of the collimated Xray beam incident upon the target circle to the energy of the X-radiation that would be incident upon the target circle if the lens were not interposed between it and the source of the Xray beam is called the concentration factor of the lens. The concentration factor is denoted by $\Sigma$. In terms of quantities defined hereinabove, the value of $\Sigma$ can be made very nearly as large as the ratio $E(D_p/D_s)^2$, provided that the working distance of the lens is kept less than $0.5(D_s)^2/\lambda_o$. The concentration factor of a lens designed with $D_p = 2.850$ t and $D_s = t$, can reach the value $\Sigma = (D_p/t)^2 E = 8.12$ E. It has been shown herein-above that E can be made as high as 0.28 for a primary collimator designed to work over a bandwidth of one octave and 0.29 for a primary collimator designed to work over a bandwidth of six and two thirds semitones, that is to say, over a bandwidth whose value is 47% as large as the shortest wavelength present. Accordingly, the concentration factor of a lens can be made very nearly as high as 2.35 for a lens designed to work over a bandwidth of six and two thirds semitones and 2.27 for a lens designed to work over a bandwidth of one octave. Lenses intended for operation at yet larger bandwidths can be designed according to the methods given hereinabove, but it can be expected that further increases in design bandwidth will further depress the concentration factor that can be realized.

A most remarkable feature of such lenses is that their operation is tolerant of variation in the diameters of the primary pupil and the secondary pupil, tolerant of variation in the distance between the two pupils, and tolerant of variation in the focal distance and the working distance. Such tolerance is best conveyed by the fact that the diameter of the monochromatically prefered pupil of the primary element is independent of design wavelength, being determined solely by the diameter of the target circle. If the diameter of the target circle need be controlled to no better than 10%, then neither need be the diameter of either the primary pupil or the secondary pupil of the lens. Moreover, if the bandwidth B of the white Xray beam incident upon any lens exceeds the design bandwidth $B_o$ of the lens, then the operation of the lens will tolerate variations in the focal distance. According to the design equations, a variation of 10% in the design wavelength, $\lambda_p$, of the preferred monochromatic pupil of the primary element of the lens will cause a change of 10% in the design value of the focal distance, whose value is $d_p$. If B exceeds $B_o$ by 10%, then there will be a latitude of 10% in the choice of $\lambda_p$ with similar variation permitted in the location of the specimen plane, that results in no change in the focal efficiency of the lens. In essence, the lens focusses upon the specimen plane that portion of the spectrum of the incident Xray beam that most advantageously fills the target circle. If B coincides with $B_o$, then a variation of 10% in the focal distance will not change by more five parts in one hundred the value of the focal efficiency of a well-designed lens. Attendant upon said variation in focal distance, the fractional change in the diameter of the region of the specimen plane that receives any preselected fraction of the total energy of the collimated beam will be yet smaller than 5%.

It can also be seen, by reference to the generalized scaling law, that the focal efficiency of a well-designed lens will not be very sensitive to errors in the realization of the design distance between the primary pupil and the secondary pupil. This is a consequence of the fact that the monochromatic diffraction efficiency and the monochromatic filling factor of an optimal pupil are nearly unaffected by deviations in the zone number at which the pupil is made to operate, so long as said zone number lies between 0.415 and 0.830.

In the operation of any lens in which the primary element and the secondary element are held in fixed relation to one another, the working distance and the focal distance will be affected in common by changes in the location of the specimen plane. The operation of any well-designed lens will be tolerant of such variations in common in the working distance and focal distance as might be occasioned by modest errors in the positioning of a target to be irradiated with the collimated Xray beam. This property may make lenses useful in photolithographic production of layered structures on surfaces that are, by design, not necessarily planar.

In principle a lens can be constructed for any desired value of t that exceeds several dozen times the value of the mean wavelength of a white Xray beam. In contemporary technology practical means can be found to fabricate pupils of practically any diameter exceeding 0.05 $\mu$m. It is therefore conceivable that lenses well adapted to irradiate a target or target circle of diameter as small as 0.1 $\mu$m can be constructed. There is no clear technological upper limit to the diameter of a target circle than can be accomodated by a lens, save that upper limit imposed by the diameter of the Xray beam available and by the maximum allowable distance between the Xray source and the plane occupied by the target circle.

There is no reason, in principle, that requires the target region to be a circle. If need were to dictate that a target region should have rectangular form, for instance, design principles similar to those utilized hereinabove could be used to design preferred pupils of rectangular shape. The ratio of the length to the width of a monochromatically preferred rectangular pupil may prove to be not the same as the ratio of the length of the rectangular target region to the width of the rectangular target region; and so the elaboration of the design would be somewhat more complicated than in the cases illustrated in the disclosure hereinabove. Furthermore, respecting a rectangular target, the focal efficiency of a collimator that realized the properties of a rectangular preferred pupil would be sensitive to the orientation of the target region, becoming higher when the shorter edge of the rectangular target area were made parallel to the longer edge of the rectangular preferred pupil than when the target area is given any other orientation.

Xrays impinging upon the materials of which any collimator is constructed may cause ionization within them. The recombination of the ions with the newly liberated electrons may lead to electromagnetic radiation of any wavelength longer than that of the incident Xrays. Such optical, ultraviolet, or Xray fluorescence must be screened from the target region, if a collimator part of a lens, or from the Xray detectors or Xray film, if the collimator is intended for Xray diffraction experiments or analyses. Since the edges of the aperture or the pupil of any collimator will be grazed incident Xray beam, there will necessarily be fluorescence assiciated with its passage through the collimator. In the case of a collimator designed as the primary element of a lens, the secondary pinhole will act to screen out any important fluorescence from the primary element. In the case of a collimator designed for Xray diffraction experiments and analyses there are two prophylactic measures to be taken. Firstly, as has been noted above, screening pinholes should be placed between the primary pinhole and the specimen. (This measure was suggested to the writer by D. Sayre.) Secondly, the material surrounding these screening pinholes should be of low atomic number, inasmuch as Xray-excited fluorescence from such materials is relatively low. [See, for instance, J. Kortright, pp. 2-19 and 2-20 in *X-ray Data Booklet*, D. Vaughan, ed., Lawrence Berkeley Laboratory, University of California, Berkeley, 1985] (This measure was suggested to the writer by J. Kirz and D. Sayre.) For incident Xray wavelengths in the 2.5 to 5.0 nm range, unhalogenated plastics such as mylar are suitable if present as layers of thickness 25 $\mu$m or greater. Such plastics are poor conductors of heat, however, and if the primary Xray beam is large in diameter compared to the entrance pupil, the plastic screen material must be protected against warping or melting under the heat developed from the absorption of Xrays within it. The screen supporting the primary pinhole must therefore be of metal (a 125 $\mu$m thick wafer of stainless steel, for instance) or of a refractory material like silicon or magnesium oxide. [Pinholes of the required diameter through 125 $\mu$m stainless steel are commercially available, for instance, from National Aperture, Inc., Lantana, FL 33462.] The primary pinhole should define the entrance pupil of the collimator. A second pinhole through a plastic wafer (125 $\mu$m thick mylar, for instance) should be placed between the primary pinhole and the specimen. [Such pinholes are available through said National Aperture, Inc., and EBTEC, Agawam, MA 01001.]

If it is to be effective in blocking fluorescence from the edges of the pupil, the screening pinholes in a collimator should slightly larger in diameter than the pupil and some some distance from it. Some of the Xrays diffracted from the pupil will graze the edges of the nearest screening pinhole, weakly creating additional fluorescence. The additional fluorescence can largely be blocked by adding a second screeing pinhole somewhat larger in diameter than the first, whose edges do not lie along any line of sight through the first screening pinhole to the collimator pupil. A third screening pinhole may be required to help block fluorescence from the second screening pinhole. improve the screening. Thus the collimator design must contemplate positioning of several very small pinholes in carefully adjusted and stable positions axially separated by intervals of $\approx 1$ cm. This means that the working distance of the collimator cannot in the present instance be made much smaller than $\approx 2$ cm. In many cases, the pupil-to-specimen distance, d, will necessarily exceed the ideal value, d*. An optimal pupil appropriate for the actual pupil-to-specimen distance will therefore have a monochromatic filling factor that is d*/d times the monochromatic filling factor of the ideal pupil.

DESCRIPTION OF THE PREFERRED EMBODIMENTS

If the pupil and the screening pinholes of a collimator are to do their job properly, they must be centered upon the collimator axis with a precision of about ⅛ diameter, or perhaps better. This means that their centers must be positioned to an accuracy of 2.5 $\mu$m (0.0001 inch) or better. Such tolerances are not out of the realm of careful machine shop practice, and the applicant has sought a mechanical solution, as opposed to a piezoelectric one.

Figure 13:
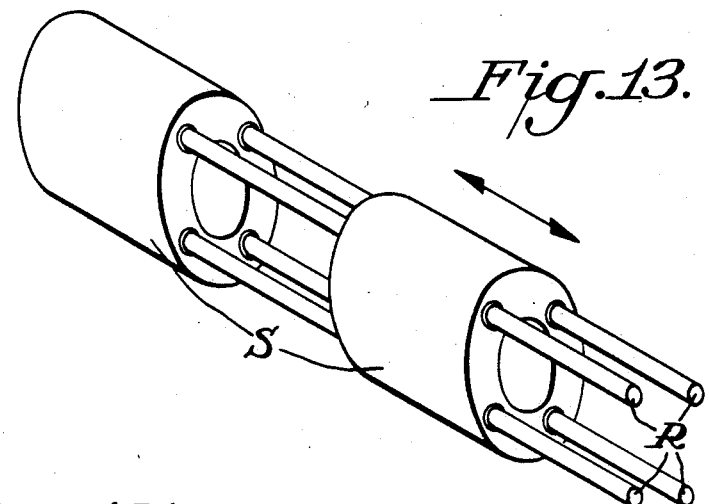
FIG. 13 is a perspective drawing showing the relation of the dowel rods, R, to two segments, S, of the collimator housing.

In the preferred embodiment the collimator containing a pupil and three screening pinholes, a collimator housing is constructed of four essentially identical, demountable segments that, when assembled, are brought into proper reference with the help of four precision ground and hardened steel dowel rods. Each of these dowel rods is long enough to extend through the completed assembly of the four demountable segments. The dowel rods are press-fitted into one of these segments which, when thus fitted, defines the base of the assembly (FIG. 13). The reference holes of the remaining segments are reamed for diametrical clearance of 0.0005 inch upon the dowel rods. There being four dowel rods passing through each segment, the precision of assembly and of reassembly after demounting will be on the order of 0.0001 inch.

Figure 14A:
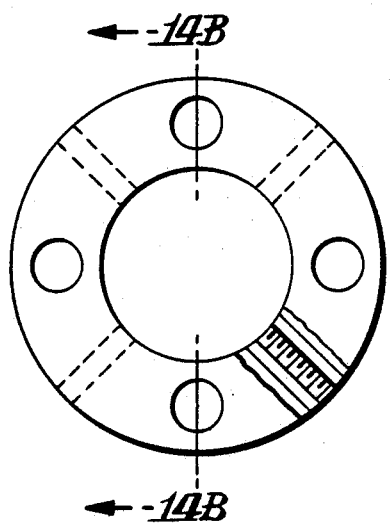
FIGS. 14A and 14B are machine drawings of one of the collimator housing segments, showing a basal view and an axial cross-section respectively.
Figure 14B:
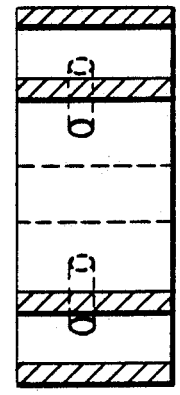

Each of the housing segments is a portion of a hollowed, accurately machined right circular cylinder sectioned perpendicular to its axis (FIG. 14). Each of the segments is numbered and indexed as to orientation. Before the final cut of their external surfaces, the segments are assembled, in their intended sequence and orientations, upon the dowel rods. A careful, accurate finishing cut is taken with the help of a lathe, leaving the external radii of the segments equal to within 0.0001 inch.

Figure 15A:
FIGS. 15A and 15B are machine drawings of one of the mounting disks, showing a basal view and an axial cross-section respectively.
Figure 15B:
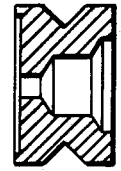

Each of the housing segments carries a mounting disc (FIG. 15) whose position can be adjusted within it. A shallow recess is machined into the mounting disc, and this carries, cemented to it, a thin stainless steel or plastic membrane pierced with a circular hole near its center. This hole is called a pinhole; its centration is accomplished by means of 6-40 set screws, either 3 or 4 in number, suitably arrayed about the periphery of the disk and threaded into the housing shell. The threaded holes in which the set screws are open to the external surface of the collimator housing, but the set screws themselves are short enough so that when the set screws are placed at their design depth, no portion of any set screw interrupts the outer surface of the collimator housing. The lateral surfaces of the mounting discs are incised with vee grooves (FIG. 15), and the bearing ends of the set screws are given by machining, or alternately by grinding, a spherical shape that makes smooth contact with the vee groove surfaces. The positions of the screws are adjusted with a hex wrench in the usual way; with no special care, a 6-40 set screw can be adjusted to an accuracy of about 1/250 turn, which, if the threads are tight and true, corresponds to an precision of 0.0001 inch in the position of its end. Thus, when the pinhole is nearly centered already in its mounting disk and the mounting disk, in turn, nearly centered in its segment, arbitrary adjustments of 0.0001 inch in the pinhole position are possible. With care, the precision can be made better than this and, when necessary, can be even further improved by spring-loading the screws or the disc and by lapping the set screws into their holes.

In one preferred embodiment of a collimator designed for the Xray beam at the X1 beam port at Brookhaven, the segments are each 0.400 inch long. The pupil-to-specimen distance is 4.0 cm, and the pupil has diameter 20 $\mu$m, the material surrounding it being type 302 stainless steel. The screening pinholes have the diameters 25, 45, and 90 microns, with the screening pinhole of smallest diameter placed closest to the pupil and the screening pinhole of largest diameter placed furthest away. The material surrounding each screening pinhole is blackened mylar. The orientation of each mounting disc is the same as for any other, so that the distance between the pupil and the first screening pinhole is four tenths of an inch and the distance separating successive screening pinholes is also four tenths of an inch. In a second preferred embodiment of a collimator designed for the Xray beam at said X1 beam port one collimator segment is omitted; the pupil-to-specimen distance is 3.0 cm, and the pupil has diameter 17 $\mu$m, and there are only two screening pinholes. The diameter of the pinhole nearer the pupil is 20 $\mu$m, and the diameter of the other pinhole is 40 $\mu$m. The orientation of each of the three mounting discs is the same as for any other.

The centration of any pinhole is accomplished as follows. The demounted housing segment, containing mounting disc with pinhole attached, is set into a horizontal vee block and viewed by an optical microscope whose horizontal axis is parallel to the axis of the vee. The pinhole is illuminated from behind with a laser or with an ordinary light source, and the housing segment is rotated in the vee block. The position of the pinhole is monitored with reference to cross-hairs in the microscope eyepiece, and the set screws are readjusted until rotation of the housing about the axis of the vee block produces suitably little motion of the pinhole. A 10X microscope objective with 10X eyepiece is suitable for such adjustment, and, in principle, will reveal displacements of as little as 1 $\mu$m (0.000 04 inch) in the position of the pinhole. Higher magnification can be used, if desired, and with patience, a precision better than 2.5 $\mu$m $\approx$ 0.0001 inch can be achieved in the centration of a 20 $\mu$m diameter pinhole.

Once the pinholes have been individually aligned, as described above, their respective housings are reassembled on the dowel rods. The entire assembly is placed back on the vee block and transilluminated by a laser beam. The success of the alignment process is judged by the symmetry of the diffraction pattern viewed or projected through the microscope.

In one preferred embodiment of a lens, the constuction and alignment are carried out as in the preferred embodiment of a collimator, save that only two segments of the collimator housing are required. One of these two segments carries the mounting disc for the primary pupil and the remaining segment carries the mounting disc for the secondary pupil. The material surrounding both the primary pupil and the secondary pupil is type 302 stainless steel, and the mounting discs are both given the same orientation. In a design for mean wavelength 3.2 nm and bandwidth 3.2 nm the diameter of the primary pupil is 9.8 $\mu$m and the diameter of the secondary pupil is 3.5 $\mu$m. The focal distance is 1.10 cm, the working distance is 0.4 mm, and the target diameter is 3.5 $\mu$m. The specimen point lies within the lens housing, that is to say, within the outlines of the secondary element. The accurately machined base and internal surface of the collimator housing segment can then be used as reference surfaces that assist in establishing with precision the location of a target specimen. In a minor modification of this preferred embodiment of a lens, the collimator housing segment that contains the secondary pupil can be shortened so that the specimen plane lies entirely outside and behind the completed lens. The clearance between the specimen plane and the nearest portion of the lens can then be made nearly as large as the working distance of the lens.

Figure 16:
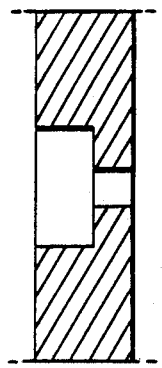
FIG. 16 is an axial cross-section of a lens. Xray opaque material is cross-hatched.

In a second preferred embodiment of a lens, a counterbored hole is milled by electron beam lithographic methods into a monolithic or laminated block or wafer of material like silicon, gallium arsenide, or other substrate that is both opaque to soft Xrays and that is also suitable for electron beam lithographic work. In general, said counterbored hole need not have any transverse cross section that is circular; but in the present preferred embodiment all transverse cross sections are, for convenience of analysis, taken as circular. The counterbore extends nearly completely through the monolithic or laminated block, and any transverse cross section of the counterbored region defines the aperture of the primary collimator. The intersection of said counterbored region with the flat external surface of the block or wafer proximal to the Xray source behaves as though it were the primary pupil. Any transverse cross-section of the the portion of the hole that has not been counterbored defines the aperture of the secondary collimator, and of said transverse cross sections the one most proximal to the Xray source behaves as the pupil of the secondary collimator. The depth of the counterbored region provides the required spacing between the primary and the secondary pupil. The configuration is shown in longitudinal cross section in FIG. 16. It is convenient to take the overall thickness of the block or wafer to be 200 $\mu$m, which thickness is typical of silicon wafers frequently used in the production of integrated circuits. The depth of the counterbored portion of a hole is then conveniently set at 190 $\mu$m. In a lens design appropriate to mean wavelength 3.2 nm and bandwidth 2.5 nm, which represents one octave, the diameter of the hole can be taken as 0.5 $\mu$m and the diameter of the counterbored region as 1.41 $\mu$m. The focal distance will then be 210 $\mu$m and the working distance will be can be taken as 20 $\mu$m. There will then be 10 $\mu$m clearance between the specimen plane and the nearest portion of the lens itself. The diameter of the specimen circle will be 0.5 $\mu$m.

Figure 17:
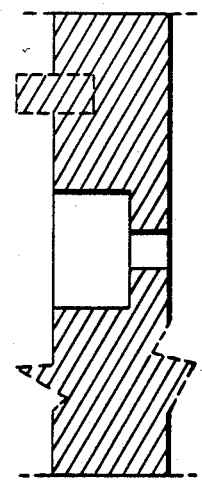
FIG. 17 is an axial cross-section of the lens already shown in FIG. 16, in which other structures have been added to the surrounding material.

In a modification of the second preferred embodiment of a lens, the laminated block or wafer in which the counterbored hole is situate is itself part of a larger structure whose other parts to not occlude any portion of the aperture of the primary element of the lens, nor any portion of the aperture of the secondary element of the lens. More strictly, any said other parts of said structure shall, if located more proximally to the Xray source than any portion of said counterbored hole, lie sufficiently far from the axis of said counterbored hole as to be without substantial influence on the distribution of intensity or complex amplitude within the incident Xray beam that impinges upon the portion of said counterbored hole that is most proximal to the Xray source. A possible arrangement of said other parts with respect to said counterbored hole is indicated FIG. 17, in which the dotted lines represent the profiles of said other parts.

Figure 19:
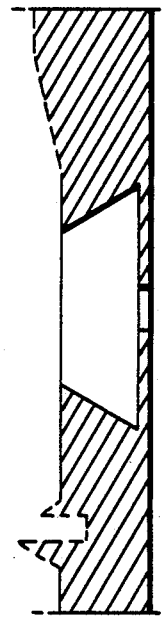
FIG. 19 is an axial cross-section of the lens already shown in FIG. 18, in which other structures have been added to the surrounding material.

In a further modification of the second preferred embodiment of a lens, the counterbored portion of the hole can be undercut by electron beam milling so that the diameter of a transverse cross-section of the undercut, counterbored portion increases with depth at which the cross-section is taken below the surface of the block or wafer that is proximal to the source of the Xray beam. In this case the intersection of the undercut, counterbored portion of the hole with said proximal surface defines the primary pupil of the lens. Representative axial cross-sections of the second preferred embodiment, thus modified, appear in FIGS. 18 and 19.

What is claimed is:

1. A lens and collimator apparatus for focussing and increasing by diffraction the intensity of an incident X-ray beam from a distant source on a pre-selected specimen point comprising a screen interposed between the source of the incident X-ray beam and a specimen plane having thereon the pre-selected specimen point, said screen aligned in a plane substantially parallel to said specimen plane, a focal spot on said specimen plane, said screen being opaque or partially opaque to the incident X-ray beam, an aperture in said screen, said aperture being transparent or partially transparent to the incident X-ray beam, said aperture in said screen located on the axis defined by the pre-selected specimen point and the source, wherein said aperture has a pupil with pupil diameter of a size comparable to and no larger than the X-ray transverse coherence length and no smaller than a specimen diameter, and with said screen positioned at a distance from the specimen plane that is proportional to the ratio of the square of the pupil diameter to the mean wavelength of the incident X-ray beam whereby the portion of the X-ray beam passing through the aperture and striking the focal spot on the specimen plane is of greater intensity than the incident X-ray beam at the screen.

2. The lens and collimator apparatus of claim 1 having an aperture with a pupil of circular cross-section.

3. The lens and collimator apparatus of claim 1 having an aperture with a pupil of non-circular cross-section.

4. A lens and collimator apparatus for focussing and increasing by diffraction the intensity of an incident X-ray beam from a distant source on a pre-selected specimen point comprising a plurality of screens interposed between the source of the incident X-ray beam and a specimen plane having thereon the pre-selected specimen point, a focal spot on said specimen plane, said screens aligned in planes substantially parallel to said specimen plane, said screens being opaque or partially opaque to the incident X-ray beam, an aperture in each of said screens, said apertures being transparent or partially transparent to the incident X-ray beam, said apertures in said screens located on the axis defined by the pre-selected specimen point and the source, wherein a first aperture-containing screen located nearest the source of the incident X-ray beam has a pupil with a pupil diameter of a size comparable to and no larger than the X-ray transverse coherence length and no smaller than a specimen diameter, and with said first screen positioned at a distance from the specimen plane that is proportional to the ratio of the square of the pupil diameter to the mean wavelength of the incident X-ray beam, whereby the portion of the X-ray beam passing through the apertures in the plurality of aperture-containing screens and striking the focal spot on the specimen plane is of greater intensity than the incident X-ray beam at the first aperture-containing screen.

5. The lens and collimator apparatus of claim 4 having apertures with pupils of circular cross section.

6. The lens and collimator apparatus of claim 4 having apertures with pupils of non-circular cross section.

7. An X-ray apparatus for focusing and increasing by diffraction the intensity of an incident X-ray beam from a distant source on a pre-selected specimen point, said apparatus having an X-ray lens and collimator and an X-ray means for providing a monochromatic X-ray beam, comprising an X-ray means for providing a monochromatic X-ray beam interposed between the source of the incident X-ray beam and a screen, the screen interposed between the X-ray modifying means and a specimen plane having thereon the pre-selected specimen point, said screen aligned in a plane substantially parallel to said specimen plane, a focal spot on said specimen plane, said screen being opaque or partially opaque to an incident X-ray beam, an aperture in said screen, said aperture being transparent or partially transparent to the incident X-ray beam, said aperture in said screen located on the axis defined by the pre-selected specimen point and the source, or when the X-ray monochromatizing means deflects the X-ray beam, located on the axis defined by the pre-selected specimen point and the X-ray monochromatizing means, wherein said aperture has a pupil with pupil diameter of a size comparable to and no larger than the X-ray transverse coherence length and no smaller than a specimen diameter, and with said screen positioned at a distance from the specimen plane that is proportional to the ratio of the square of the pupil diameter to the mean wavelength of the incident X-ray beam whereby the portion of the X-ray beam passing through the aperture and striking the focal spot on the specimen plane is of greater intensity than the incident X-ray beam at the screen.

8. An X-ray apparatus for focusing and increasing by diffraction the intensity of an incident X-ray beam from a distant source on a pre-selected specimen point, said apparatus having an X-ray lens and collimator and an X-ray means for providing a monochromatic X-ray beam, comprising an X-ray means for providing a monochromatic X-ray beam interposed between the source of the incident X-ray beam and a plurality of screens, the plurality of screens interposed between the X-ray modifying means and a specimen plane having thereon a pre-selected specimen point, a focal spot on said specimen plane, said screens aligned in planes substantially parallel to said specimen plane, said screens being opaque or partially opaque to an incident X-ray beam, an aperture in each of said screens, said apertures being transparent or partially transparent to the incident X-ray beam, said apertures in said screens located on the axis defined by the pre-selected specimen point and the source, or when the X-ray monochromatizing means deflects the X-ray beam, located on the axis defined by the pre-selected specimen point and the X-ray monochromatizing means, wherein a first aperture-containing screen located nearest the source of the incident X-ray beam has a pupil with a pupil diameter of a size comparable to and no larger than the X-ray transverse coherence length and no smaller than a specimen diameter, and with said first screen positioned at a distance from the specimen plane that is proportional to the ratio of the square of the pupil diameter to the mean wavelength of the incident X-ray beam, whereby the portion of the X-ray beam passing through the apertures in the plurality of aperture-containing screens and striking the focal spot on the specimen plane is of greater intensity than the incident X-ray beam at the first aperture-containing screen.

* * * * *